United States Patent
Ishii et al.

(10) Patent No.: US 6,873,552 B2
(45) Date of Patent: Mar. 29, 2005

(54) NONVOLATILE MEMORY SYSTEM, SEMICONDUCTOR MEMORY, AND WRITING METHOD

(75) Inventors: Tatsuya Ishii, Kodaira (JP); Hitoshi Miwa, Ome (JP); Osamu Tsuchiya, Hamura (JP); Shooji Kubono, Akishima (JP)

(73) Assignees: Renesas Technology Corp., Tokyo (JP); Hitachi ULSI Engineering Corp., Tokyo (JP)

( * ) Notice: Subject to any disclaimer, the term of this patent is extended or adjusted under 35 U.S.C. 154(b) by 0 days.

(21) Appl. No.: 10/681,280

(22) Filed: Oct. 9, 2003

(65) Prior Publication Data

US 2004/0114434 A1 Jun. 17, 2004

Related U.S. Application Data

(63) Continuation of application No. 10/388,444, filed on Mar. 17, 2003, now Pat. No. 6,683,811, which is a continuation of application No. 10/095,565, filed on Mar. 13, 2002, now Pat. No. 6,567,311, which is a continuation of application No. 09/961,300, filed on Sep. 25, 2001, now Pat. No. 6,385,092, which is a continuation of application No. 09/714,552, filed on Nov. 17, 2000, now Pat. No. 6,392,932, which is a continuation of application No. 09/468,329, filed on Dec. 21, 1999, now Pat. No. 6,157,573, which is a continuation of application No. 09/342,231, filed on Jun. 29, 1999, now Pat. No. 6,023,425, which is a continuation of application No. 09/135,175, filed on Aug. 18, 1998, now Pat. No. 5,982,668, which is a continuation of application No. 08/889,191, filed on Jul. 8, 1997, now Pat. No. 5,867,428.

(30) Foreign Application Priority Data

| Jul. 9, 1996 | (JP) | ................................. 8-178965 |
| May 16, 1997 | (JP) | ................................. 9-126793 |

(51) Int. Cl.$^7$ ............................................. G11C 16/04
(52) U.S. Cl. ........................... 365/185.24; 365/185.02; 365/185.29
(58) Field of Search ............................. 365/171, 185.24, 365/189.05, 185.29, 185.02, 230.08

(56) References Cited

U.S. PATENT DOCUMENTS

| 5,303,198 A | 4/1994 | Adachi et al. ............... 365/218 |
| 5,327,383 A | 7/1994 | Merchant et al. ........... 365/218 |
| 5,347,489 A | 9/1994 | Merchant et al. ........... 365/203 |
| 5,509,134 A | 4/1996 | Fandrich et al. ............ 395/430 |
| 5,541,886 A | 7/1996 | Hasbun ................. 365/230.01 |
| 5,982,668 A | 11/1999 | Ishii et al. ............. 365/185.24 |
| 6,023,425 A | 2/2000 | Ishii et al. ............. 365/185.24 |
| 6,067,598 A | 5/2000 | Roohpavar et al. ......... 711/103 |
| 6,157,573 A | 12/2000 | Ishii et al. ............. 365/185.24 |
| 6,333,871 B1 | 12/2001 | Tsujikawa et al. ..... 365/185.28 |
| 6,496,418 B2 | 12/2002 | Kawahara et al. ..... 365/185.24 |
| 6,507,520 B2 | 1/2003 | Tsujikawa et al. ..... 365/185.28 |

FOREIGN PATENT DOCUMENTS

| JP | 62-099996 | 5/1987 |
| JP | 4-147495 | 5/1992 |

*Primary Examiner*—Richard Elms
*Assistant Examiner*—Hien Nguyen
(74) *Attorney, Agent, or Firm*—Mattingly, Stanger, Malur & Brundidge, P.C.

(57) ABSTRACT

A nonvolatile semiconductor memory recovers variation in the threshold of a memory cell due to disturbance related to a word line. The nonvolatile memory continuously performs many writing operations without carrying out single-sector erasing after each writing operation, performing the additional writing operations quicker than the usual writing operation, and lightening the burden imposed on software for use in additional writing. The data stored in a designated sector is read out before being saved in a register, and the selected sector is subjected to single-sector erasing when a predetermined command is given. Then write expected value data is formed from the saved data and data to be additionally written, completing the writing operation.

9 Claims, 19 Drawing Sheets

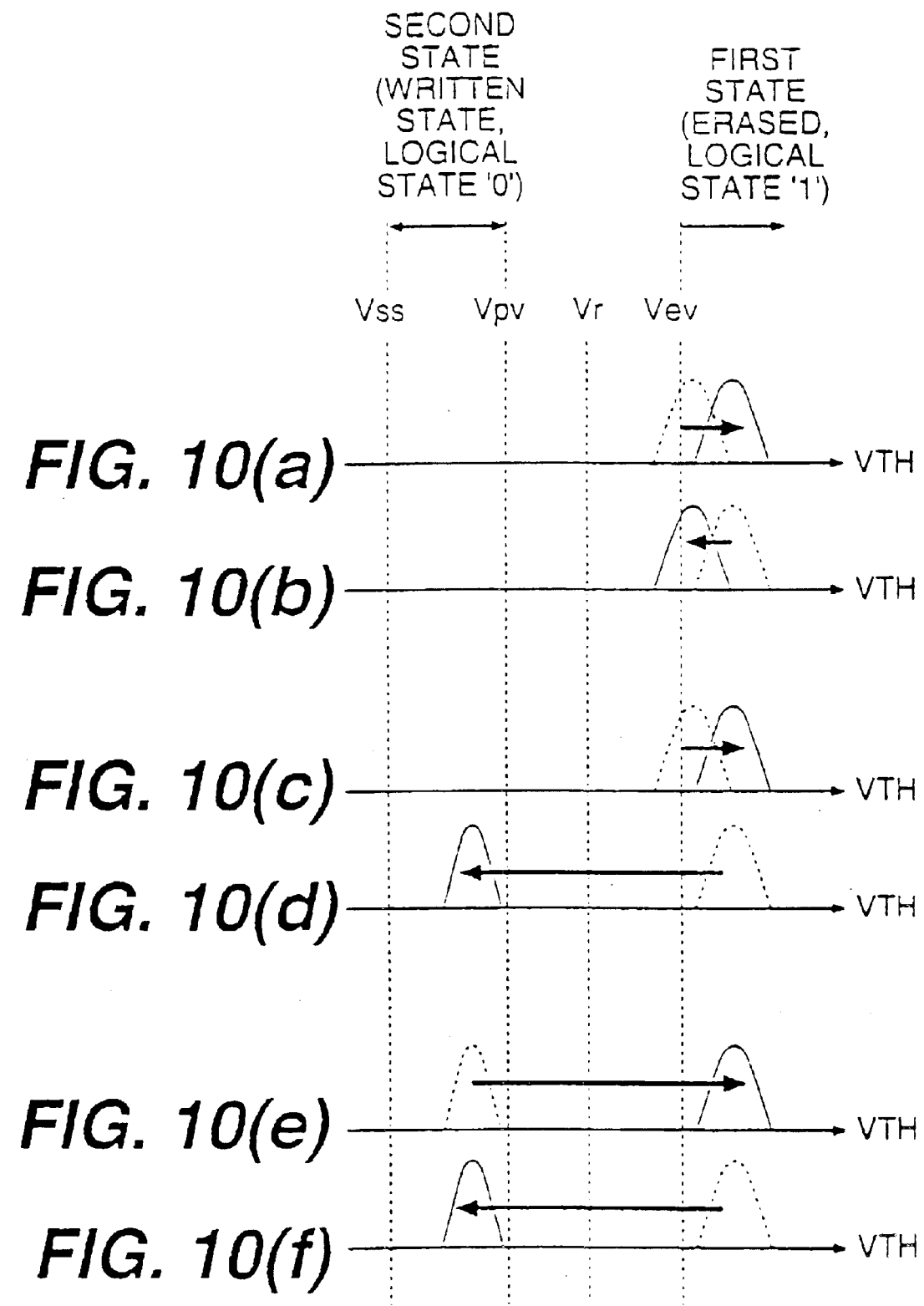

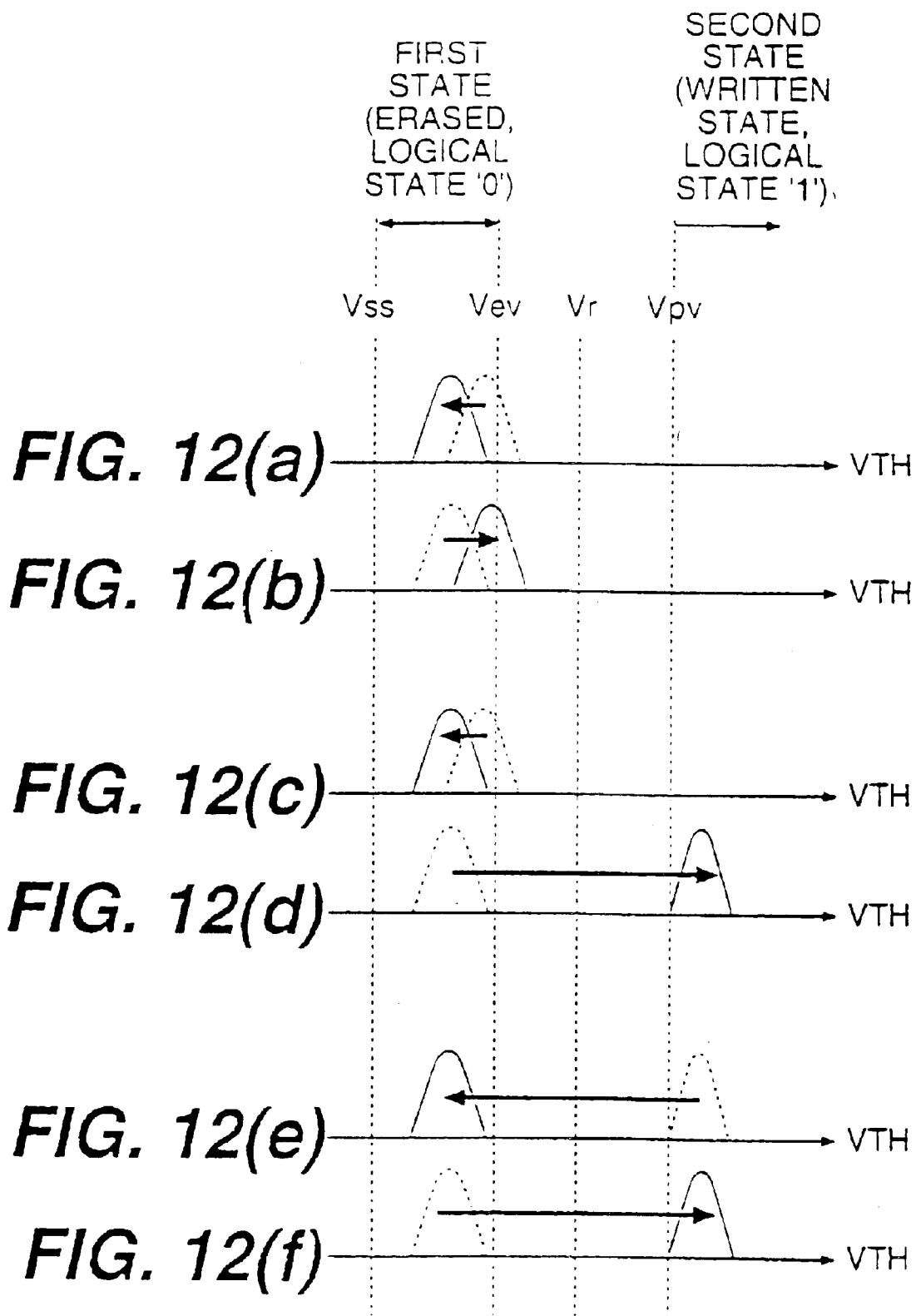

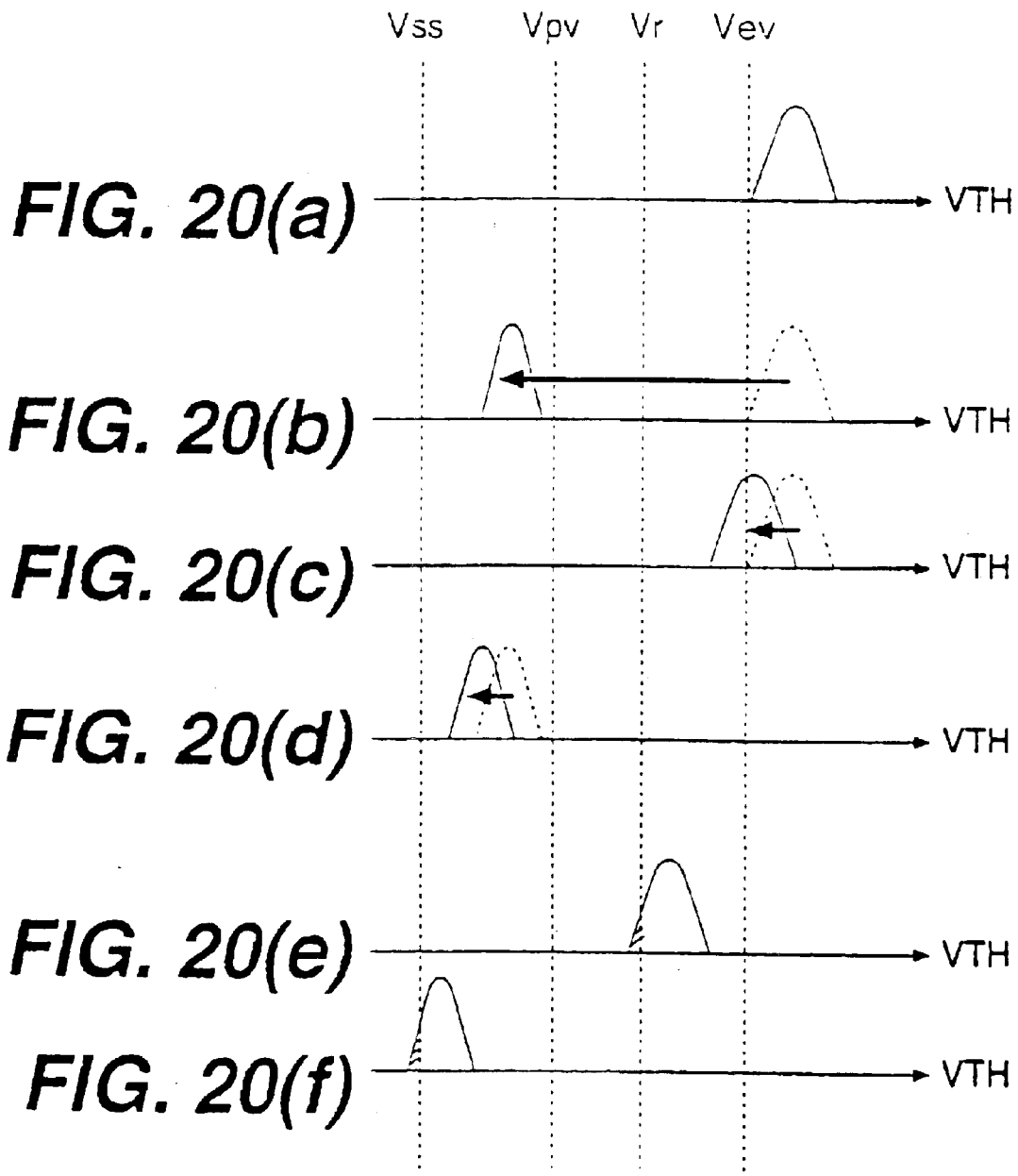

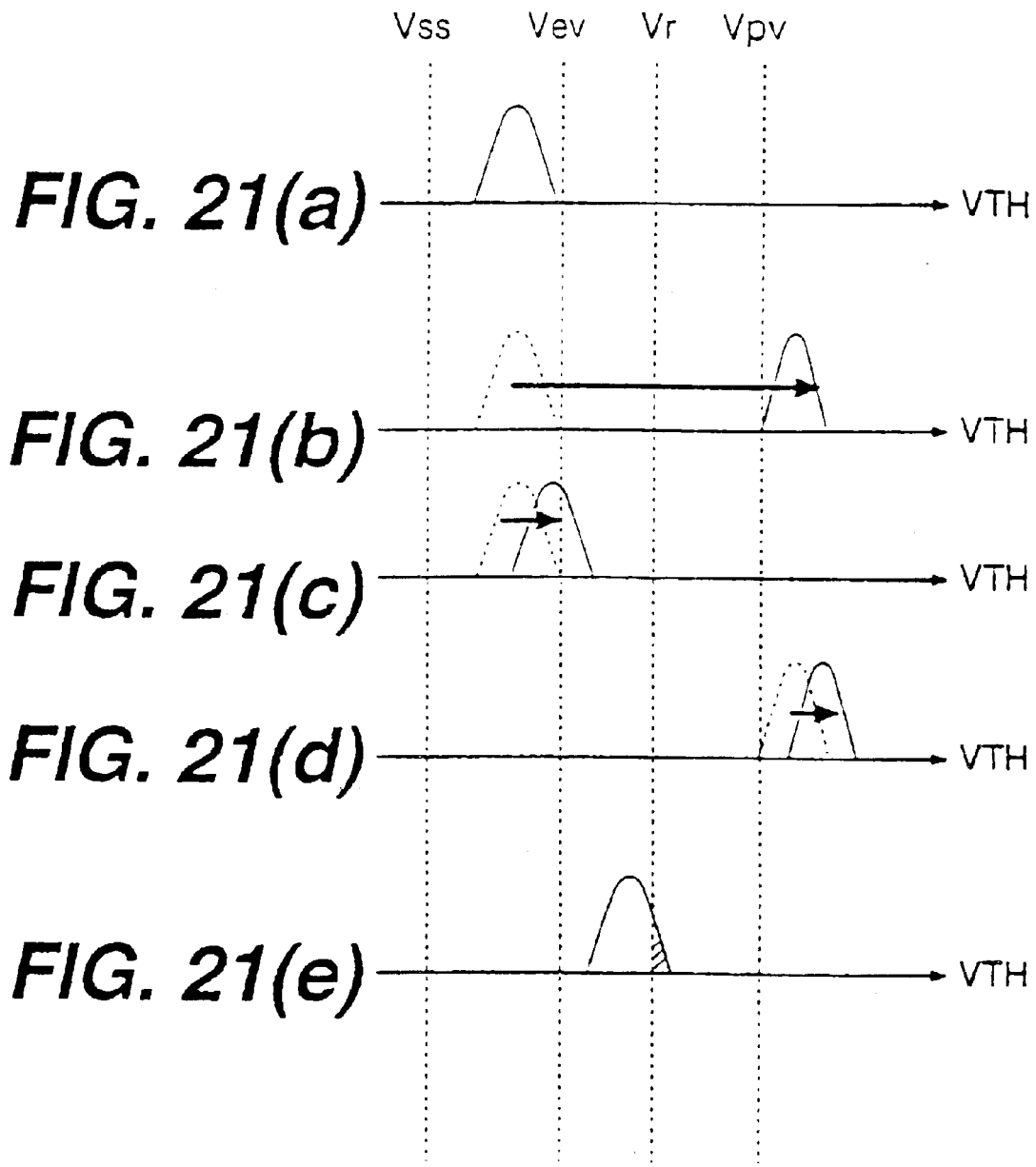

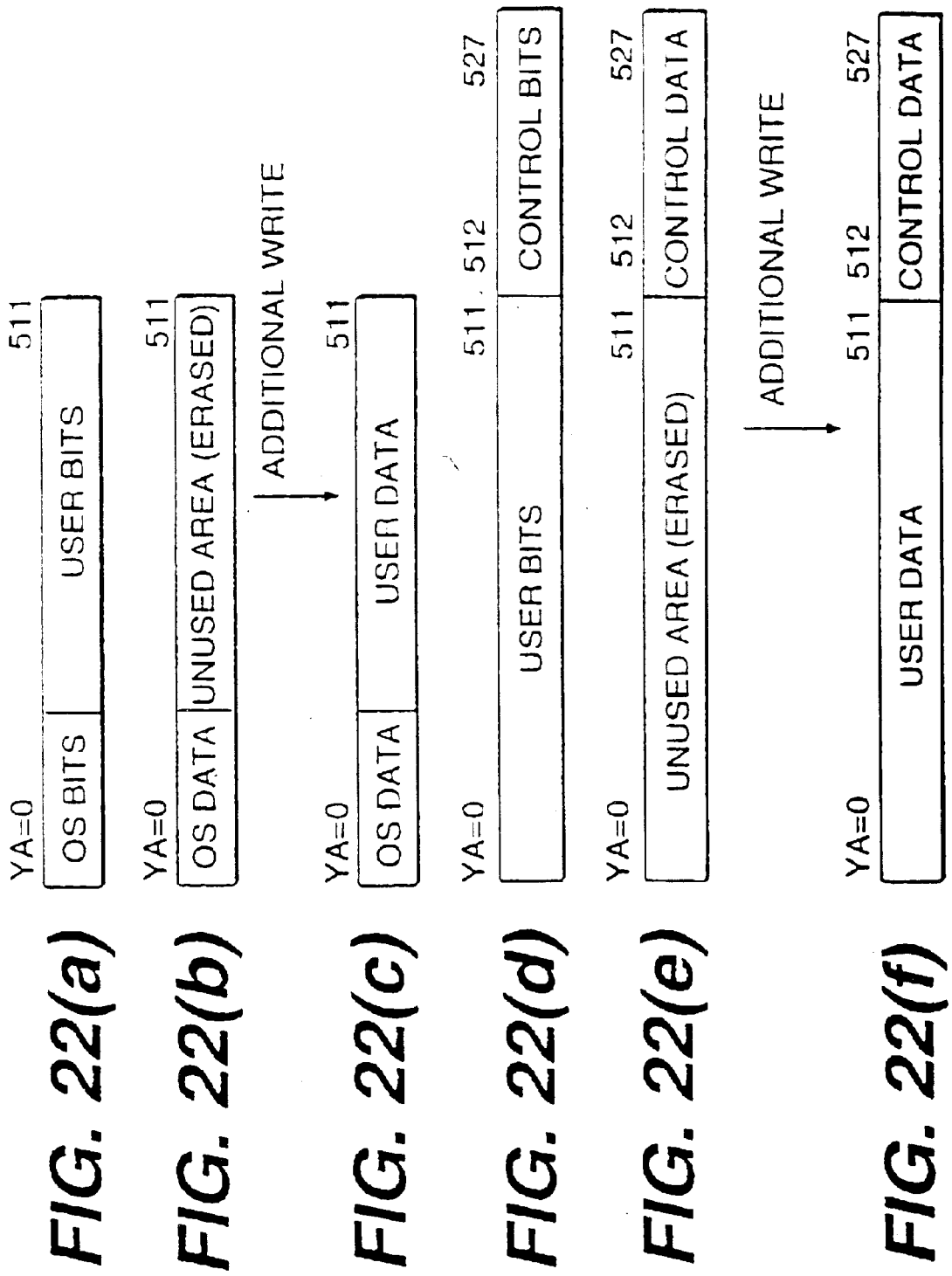

SECOND STATE (WRITTEN STATE, LOGICAL STATE '0')

FIRST STATE (ERASED STATE, LOGICAL STATE '1')

Vss  Vpv  Vr  Vev

FIG. 23(a) → VTH

FIG. 23(b) → VTH

FIG. 23(c) → VTH

FIG. 23(d) → VTH

FIG. 23(e) → VTH

FIG. 23(f) → VTH

NONVOLATILE MEMORY SYSTEM, SEMICONDUCTOR MEMORY, AND WRITING METHOD

This is a continuation application of U.S. Ser. No. 10/388,444, filed Mar. 17, 2003, now U.S. Pat. No. 6,683,111,; which is a continuation application of U.S. Ser. No. 10/095,565, filed Mar. 13, 2002, now U.S. Pat. No. 6,567,311; which is a continuation application of U.S. Ser. No. 09/961,300, filed Sep. 25, 2001, now U.S. Pat. No. 6,385,092; which is a continuation application of U.S. Ser. No. 09/714,552, filed Nov. 17, 2000, now U.S. Pat. No. 6,392,932; which is a continuation application of U.S. Ser. No. 09/468,329, filed Dec. 21, 1999, now U.S. Pat. No. 6,157,573; which is a continuation application of U.S. Ser. No. 09/342,231, filed Jun. 29, 1999, now U.S. Pat. No. 6,023,425; which is a continuation application of U.S. Ser. No. 09/135,175, filed Aug. 18, 1998, now U.S. Pat. No. 5,982,668; which is a continuation application of U.S. Ser. No. 08/889,191, filed Jul. 8, 1997, now U.S. Pat. No. 5,867,428. This application is related to U.S. Ser. No. 09/323,684, filed Jun. 2, 1999, now U.S. Pat. No. 6,009,016 and U.S. Ser. No. 09/993,685, filed Nov. 27, 2001, now U.S. Pat. No. 6,452,838.

BACKGROUND OF THE INVENTION

1. Field of the Invention

The present invention relates to information writing for a nonvolatile semiconductor memory, and more particularly to a nonvolatile memory system with improved single-sector erasing.

2. Description of the Related Art

A flash memory, which is a kind of EEPROM (Electrically Erasable Programmable Read Only Memory), employs nonvolatile memory elements, such as MOSFETS, (metal-oxide semiconductor field-effect transistors), each having a control gate and a floating gate. The flash memory stores information in individual memory cells, each constituted by a MOSFET according to the transistor threshold voltage. In such a flash memory, the threshold voltage is set low (logic "0") during the writing operation by putting the drain voltage of the nonvolatile memory element at, for example, 5 V, and by putting the word line connected to the control gate CG at, for example, −10 V as shown in FIG. 18, so as to draw electrical charge from the floating gate FG into the drain region. During an erasing operation, the threshold is set high (logic "1") by putting the well region at −5 V, for example, and the control gate CG at a voltage as high as 10 V (logic "1") so as to inject negative charge into the floating gate FG as shown in FIG. 19. Thus, one-bit data is stored in one memory cell.

SUMMARY OF THE INVENTION

In a typical conventional flash memory, control gates of a plurality of memory cells are connected to one word line. With the plurality of memory cells connected to the word line as a basic unit (hereinafter called a 'sector'), erasing, writing, and reading operations are performed in respective operating modes. For example, the erasing operation is simultaneously performed in a plurality of memory cells having a common word line, on a sector basis, and a specific memory cell is not selectively erasable.

On the other hand, the conventional writing operation is performed by raising the threshold as shown in FIG. 20(a) after the sector erasing operation has been performed once, applying −10 V to the word line connected to the memory cell whose threshold is to be lowered, and applying 5 V to the drain. As a result, the threshold of the written memory cell becomes lower than the verify voltage Vpv as shown in FIG. 20(b).

Although 0 V is applied to the drains of memory cells that are not written, that is, those whose thresholds are not intended to be lowered, a voltage as great as −10 V is applied to the gates of the other memory cells sharing the word line with the written cell. Consequently, there occurs a phenomenon, called a "disturbance", in which the threshold is slightly lowered for all of the memory cells connected to the word line. Even memory cells that are not to be written are subjected to a slight threshold voltage change (in this instance, voltage drop), though only the threshold of a specific memory cell to be written is desired to be varied. This disturbance is called a "disturbance related to a word line", or "word disturbance", since it occurs when voltage is applied mainly to the word line.

Due to the word disturbance, the writing operation requires prior single-sector erasing, as shown with reference to FIGS. 20(a)–20(f). When the plurality of memory cells connected to a common word line are subjected to single-sector erasing initially, the thresholds of the plurality of memory cells are all put in the erased state (FIG. 20(a)). Then, the writing operation is performed so as to put the threshold of a specific memory cell selectively in the written state (FIG. 20(b)). At this time, the plurality of memory cells substantially consist of a first memory cell group whose threshold voltage is in the erased state (shown by a dotted line of FIG. 20(c)) and a second memory cell group whose threshold voltage is in the written state (shown by a dotted line of FIG. 20(d)).

Since the memory cells cannot be erased selectively, only the first memory cell group remains writable. Therefore, any one of the cells in the first memory cell group can be selected and written. Then, when the word disturbance occurs, the threshold voltage of the not-written memory cells is lowered, as shown by a solid line in FIGS. 20(c)–20(d).

If no single-sector erasing is performed, the multiple repetition of disturbance resulting from repeated writing operations lowers the threshold of the memory cell below a word line reading voltage level Vr at the time of reading data, as shown in FIG. 20(e), and causes error data to be read out. Further, the threshold of the memory cell becomes lower than the ground potential Vss, whereby the memory cell is turned ON even though not selected, as shown in FIG. 20(f). When a memory cell connected to a different word line but to a common source line is selected, the charge on the data line flows into the source through the memory cell whose threshold is lower than the aforementioned ground potential Vss, with the result again that error data may be read out.

A system of increasing the threshold of a memory cell through the writing operation is also known, by making the low threshold state an erased state depending on the memory array configuration. However, a disturbance phenomenon still exists in such a writing system because the threshold of a non-written memory cell having a common word line at the time of writing becomes slightly higher (see FIGS. 21(c), 21(d)). When disturbance is repeated several times, the threshold of the memory cell becomes higher than the word line reading level Vr at the time of reading data as shown in FIG. 21(e). Again, error data may be read out.

FIGS. 22(a)–22(f) show an information map of sectors controlled by one word line. As shown in FIGS. 22(a)–22(c), a 512-byte (4096-bit) memory cell is connected to one word line. The effective utilization of the memory can be planned by providing within the same sector a mixture of a storage area (hereinafter called the "system area"), which is usually not written by general users, for storing OS (operating system) information, sector control information and the like, and a storage area (hereinafter called the "user area") to which users are allowed to write information freely. The number of bits in the system area is far smaller than the number of bits in the user area.

In the flash memory of such a storage system, predetermined data is written to the system area, whereas the unwritten user area is offered to the user. It would be convenient to be able to selectively write to the memory cells in the large user area so as to permit repeated "additional" writing operations, without affecting the already-written system area, and without first erasing the system area. In other words, it would be convenient for the user to be able to write to the unwritten user area without requiring an intermediate sector erase. However, such additional writing operations have not been possible because of disturbance, which prevents the reliability of information stored in the conventional flash memory from being assured.

Even though such additional writing has been conceivable, there has been a substantial limit on the number of additional writing operations to be repeated continuously in consideration of the threshold variation due to the disturbance. By way of example, as few as two consecutive writing operations have compromised the integrity of stored data in the prior art, due to disturbance.

Furthermore, the memory itself has not been designed for use in the manner mentioned above. For this reason, if additional writing is carried out in the conventional flash memory, the time required for the additional writing is extremely long, a burden too heavy for the system software because of the necessity to synthesize the read data and the additional write data, and to write the data combination after reading out the data in the sector involved and then subjecting the sector to single-sector erasing as discussed above.

An object of the present invention is to provide a nonvolatile semiconductor memory that is capable of recovering a variation in the threshold of a memory cell due to disturbance related to a word line.

Another object of the present invention is to provide a nonvolatile semiconductor memory that is capable of continuously performing an additional writing operation without carrying out a single-sector erase for each write.

Still another object of the present invention is to provide a nonvolatile semiconductor memory that is capable of performing an additional writing operation at a speed higher than that which is required for the usual writing operation, lightening the burden imposed on software for use in additional writing.

A brief description will be given of the substance of the invention disclosed in the present specification.

The data stored in a sector at a designated address is read out before being saved in a register, and the sector involved is subjected to single-sector erasing when a predetermined instruction (command) is given. Actual write data (hereinafter called the "write expected value data") is formed from the saved data and data to be additionally written, so that a writing operation is performed.

The flash memory system comprises a plurality of memory cells for storing information in conformity with first and second threshold voltage states. The memory cells are arranged in a functional memory array having a word line connected to control gates of the plurality of memory cells, and a sequencer which has a command input terminal for controlling erase and write operations on information stored or to be stored in the plurality of memory cells in accordance with an instruction which is input to the command input terminal. The instruction that the sequencer receives may be an erase command for collectively putting the plurality of memory cells in the first (erased) state, or an "additional write command" for selectively changing at least one of the memory cells from the first state to the second state, the additional write command being used for executing not the erase command, but a write operation performed continuously (i.e., a plurality of times without an intervening sector erase).

In a more preferable embodiment of the invention, some of the plurality of memory cells whose threshold voltage is in the first state constitute a first memory group, and the rest constitute a second memory group. According to the additional write command, then, the following steps are taken: The threshold voltage of the memory cells in the second memory cell group is placed between the first state and the second state, and subsequently at least one memory cell selected from those in the first memory cell group is put in the second state, along with those in the second memory cell group.

According to a further preferable embodiment of the invention, the instruction that the sequencer receives includes an erase command for causing a first voltage to be applied to the word line to collectively put the threshold voltage of the plurality of memory cells in the first state. Then, a first write command causes a second voltage to be applied to the word line to put the threshold voltage of memory cells in the selected first memory cell group in the second state, and a second write command causes the first voltage to be applied so as to change the threshold voltage of the plurality of memory cells from the second state to the first state. The second voltage is then applied to the word line to put the threshold voltage of memory cells in the selected second memory cell group in the second state.

Thus, the variation in the threshold voltage of the memory cells due to the word disturbance at the time of the additional writing is recovered, and error data is prevented from being read. Consequently, it is possible to increase greatly the number of times that additional writing is continuously carried out without executing an erasing instruction. By way of example, the present invention is capable of performing 15 consecutive write operations without an intervening sector erase.

By using additional write data fed from the outside and the data read from the selected sector and held in the internal register, the write expected value data is arranged to be automatically formed inside, and then the writing operation is performed. With this arrangement, the additional writing operation can be performed at a speed higher than the ordinary writing, and the burden imposed on software at the time of additional writing is lightened.

These and other objects, advantages, and novel features of the present invention will become apparent from the following detailed description when read in connection with the accompanying drawings.

BRIEF DESCRIPTION OF THE DRAWINGS

FIGS. 10(a)–10(f) explain the variation in the threshold of a memory cell in a flash memory according to an embodiment of the invention.

FIGS. 12(a)–12(f) explain the variation in the threshold of a memory cell in the flash memory of FIG. 11.

FIGS. 20(a)–20(f) show the variation in the threshold of the memory cell in a conventional flash memory.

FIGS. 21(a)–21(e) show the variation in the threshold of the memory cell in another conventional flash memory.

FIGS. 22(a)–22(f) collectively show an exemplary arrangement of an additionally writable sector in a flash memory.

FIGS. 23(a)–23(f) explain the variation in the threshold of a memory cell in a flash memory according to an embodiment of the invention.

DETAILED DESCRIPTION OF THE PREFERRED EMBODIMENTS

A description will subsequently be given of the present invention applied to a flash memory and embodiments thereof by reference to the accompanying drawings.

<Embodiment 1>

Figure 1:
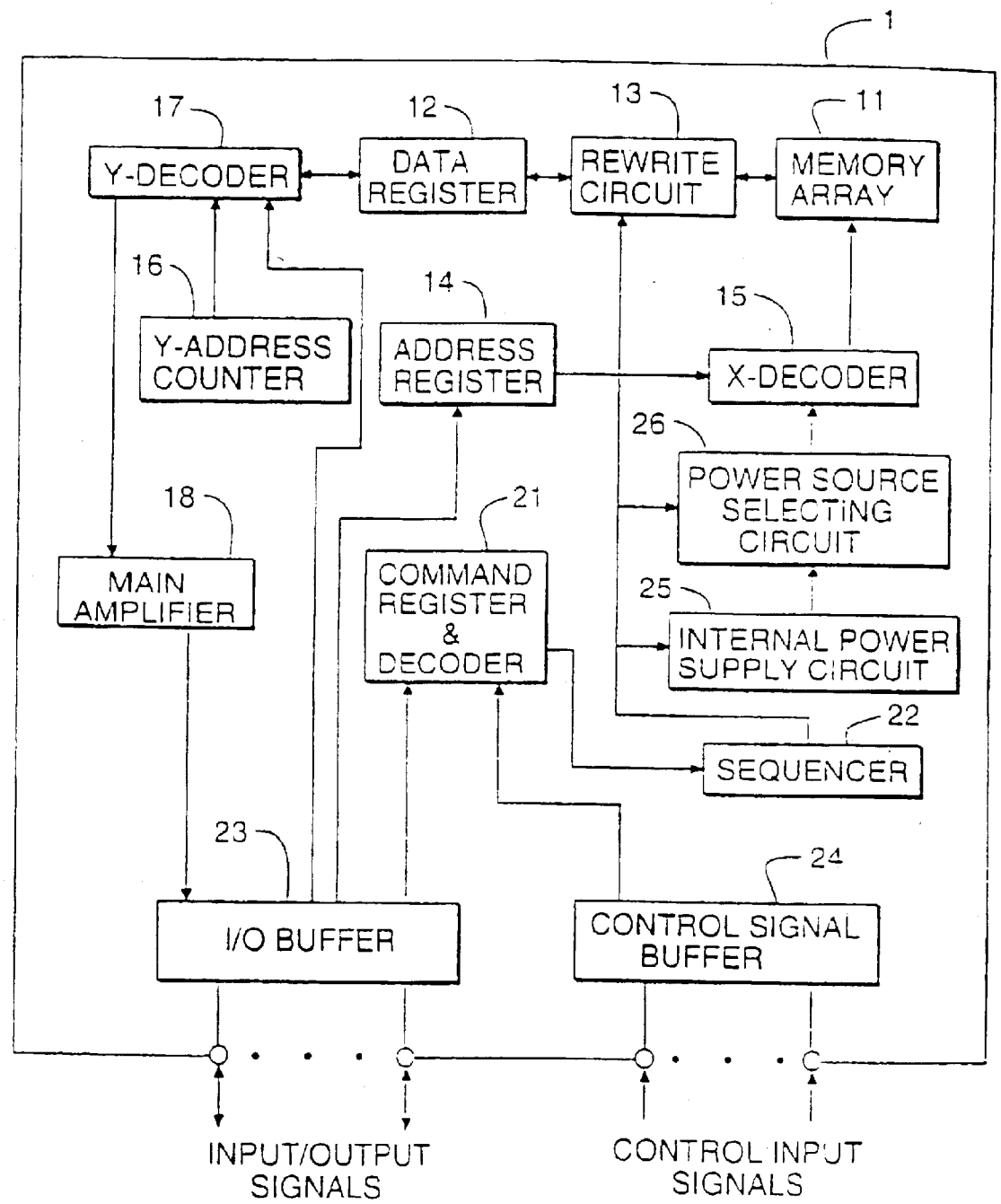
FIG. 1 is a schematic overall block diagram illustrating a flash memory embodying the present invention.

FIG. 1 shows a flash memory embodying the present invention. Each of the circuit blocks in FIG. 1 is shown formed on one semiconductor chip 1 of single-crystal silicon, although the invention is not so limited.

Figure 18:
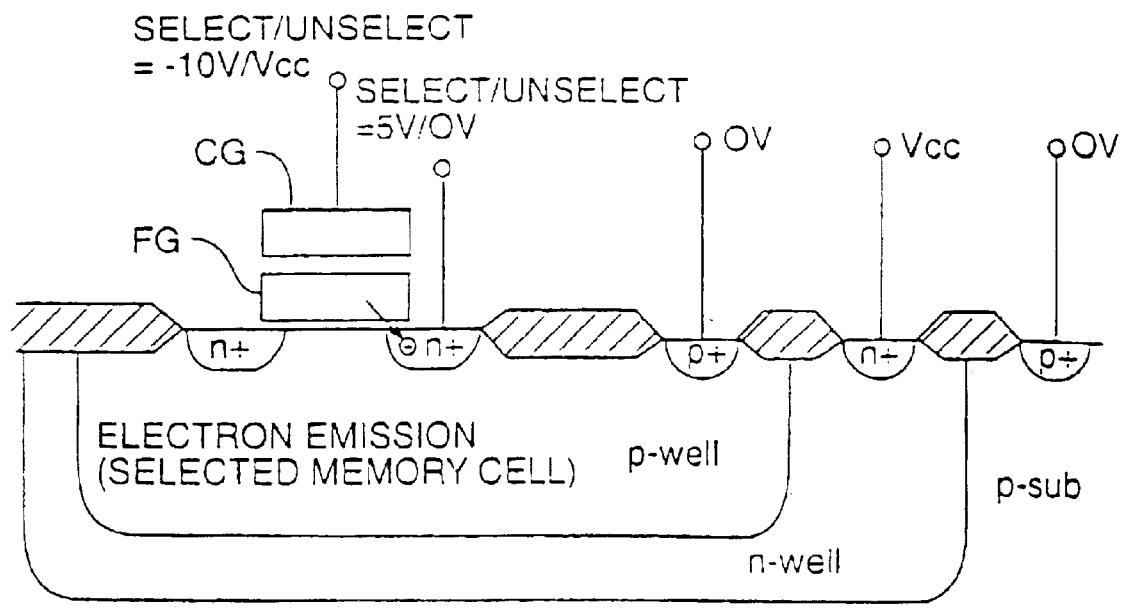
FIG. 18 is a sectional view showing an example of applied voltage at the time of writing a memory cell in a flash memory.

In FIG. 1, a memory array 11 is constituted by a plurality of individual transistor cells arranged in a matrix, each of which has a floating gate as shown in FIG. 18. A data register 12 holds data of one sector read from the memory array 11 and write data fed from the outside, and a rewrite circuit 13 is provided between the memory array 11 and the data register 12.

An address register 14 holds an address signal fed from the outside, an X-decoder 15 selects one word line out of the word lines within the memory array 11 and which corresponds to the address received by the address register 14, and a Y-address counter 16 sequentially transfers the write data received from the outside to the data register 12 and generates a Y-address signal (data-line selecting signal) for outputting the data that has been read into the data register 12 outside. The Y-address counter 16 has the function of sequentially updating the leading address of one sector up to its final address and outputting the updated result, in conjunction with a Y-decoder 17 that decodes the Y-address generated so as to select one data within the one sector, and a main amplifier 18 for amplifying the data read into the data register 12 and outputting the amplified data.

The flash memory according to the present embodiment of the invention has a data input/output interface that can be serially accessible, although the flash memory is not so limited. At the time of reading, for example, one word line is selected when the address of a sector to be read is input, and data are read in parallel from the plurality of memory cells connected to the word line and then held in a sense latch SLT group once, which will be described later. The sense latch group is contained in the data register 12 and successively selected by the Y-address counter, the data held therein being serially output. At the time of writing, serial data are input and written to the selected sector via a reverse path. Further, a plurality of input/output terminals are provided for the memory chip, via which data equivalent to one sector are divided and serially input/output.

Although not limited thereto, the flash memory according to this embodiment of the invention further comprises a command register & decoder 21 for holding commands supplied from an external CPU and the like and decoding the commands, and a control circuit (sequencer) 22 for sequentially forming control signals intended for respective circuits in the memory so as to perform a process corresponding to the command on the basis of the result decoded by the command register & decoder 21. When a command is given, the flash memory is adapted to decode the command and automatically start performing a corresponding process.

Like the control unit of a CPU of a microprogram system, for example, the control circuit 22 has a ROM (Read Only Memory) in which is stored a series of microinstructions for executing commands. When the command register & decoder 21 generates the leading address of the microinstructions corresponding to the command and provides the control circuit 22 with the leading address, a microprogram can be arranged so that it is started then. Software installed in the ROM is stored with an instruction procedure which will be described with reference to FIG. 4, and conditions including the duration of voltage application and the like. The ROM may be loaded with only a minimum of microinstructions, whereas a rewritable flash memory may be stored with instruction conditions and additional programs.

Further, the flash memory according to this embodiment of the invention is provided with, in addition to the aforementioned circuits, an I/O buffer 23 for inputting/outputting an address and a data signal, a control signal buffer 24 for receiving the control signal supplied from the external CPU and the like, and an internal power supply circuit 25 for generating voltages necessary within the chip, including write voltage Vw (−10 V) applied to the word line on the basis of source voltage Vcc, erasing voltage Ve (10 V), read voltage Vr (2 V), verify voltage Vpv (1 V), and the like. A power source selecting circuit 26 for selecting a desired one of these voltages in accordance with the operating state of the memory is also provided, and supplies the selected voltage to the memory array 11, X-decoder 15 and the like. Incidentally, Vw and Ve, which are greater than the source voltage, are generated by an on-chip charge pump circuit included in the internal power supply circuit 25.

In the flash memory according to this embodiment of the invention, an address signal, a write data signal and a command input share an external I/O terminal (pin) in common, although no limitation is intended. Therefore, the I/O buffer 23 operates so as to distinguish between these input signals according to a control signal from the control signal buffer 24, receives one of the input signals, and then supplies it to a predetermined internal circuit.

The control signals fed from the external CPU and the like into the flash memory according to this embodiment of the invention include, for example, a reset signal RES, a chip enable signal CE, a write enable signal WE, an output enable signal OE, a command data enable signal CDE (for indicating whether the signal is a command, data input, or address input), a system clock signal SC, and the like.

An external general-purpose microcomputer LSI may be used to control this apparatus because it is only necessary for the apparatus to be equipped with an address generating function and a command generating function.

Figure 2:
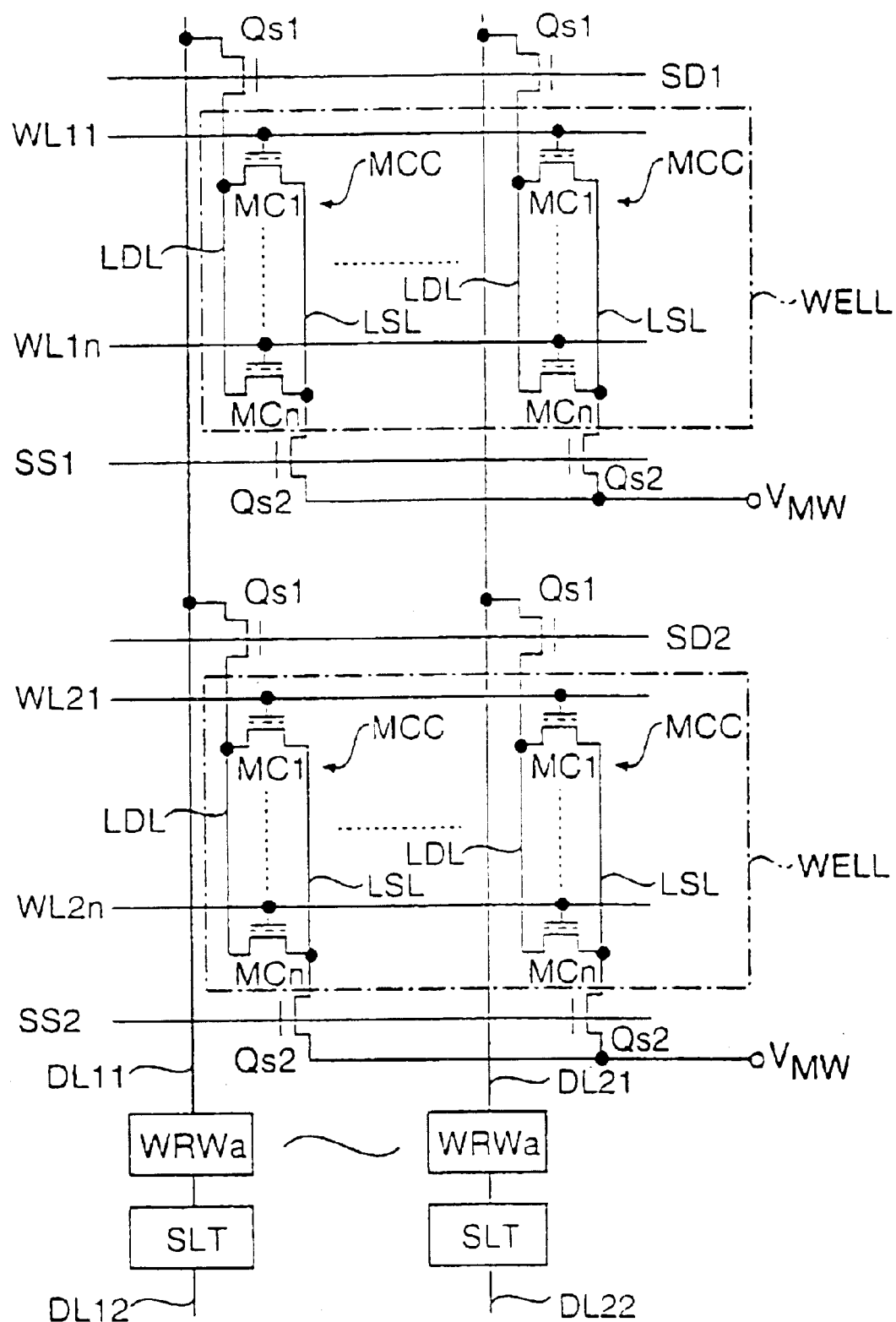
FIG. 2 is a circuit diagram showing an exemplary arrangement of a memory array of a flash memory according to the present invention.

FIG. 2 shows a specific example of a system for lowering the threshold of a memory cell by writing, according to the teachings of the present invention. The memory array 11 according to this embodiment of the invention comprises two mats; FIG. 2 shows a specific example of one of the memory mats. As shown in FIG. 2, each memory mat has a memory train MCC, including n parallel memory cells (MOSFETs having floating gates) MC1–MCn, which are arranged in the vertical direction and whose sources and drains are commonly connected together. A plurality of memory trains MCC are arranged in the horizontal direction (in the direction of word lines WL) and in the vertical direction (in the direction of data lines DL).

In each of the memory trains MCC, the drains and sources of the n memory cells MC1–MCn are connected to a common local data line LDL and a common local source line LSL. The local data line LDL can be connected via a selection MOSFET Qs1 to a main data line DL, and the local source line LSL can also be connected via a selection MOSFET Qs2 to the grounding point or negative voltage. Those memory trains MCC that are arranged in the direction of word lines are formed in the same well area WELL on a semiconductor substrate.

Though not so limited, the system having the described memory array arrangement, and which assumes the erased state at high threshold voltage and the written state at low threshold voltage, may be called an AND type flash memory as shown in FIG. 2. At this time, injecting electrons into the floating gate (which raise the threshold voltage to attain the erased state) employs, though not so limited, FN (Fowler-Nordheim) tunnel injection from a transistor channel, and FN tunnel emission to a diffusion layer is employed for drawing electrons from the floating gate (to lower the threshold voltage to attain the written state).

Those memory trains MCC that are arranged in the direction of the word lines are formed in the same well area WELL on the semiconductor substrate. A negative voltage of −3 V is applied to the well area WELL and the respective local source lines LSL when data is erased, and a voltage of 10 V is applied to the word lines having the common well area, making possible single-sector erasing. The selection MOSFET Qs2 is turned on at the time of erasing data, so that a negative voltage of −3 V is applied to the source of each memory cell. At this time, the selection MOSFETs Qs1 are turned off and the drain is set at −3 V when the source-side voltage is applied through the channel of each memory cell which is turned on as the control gate is supplied with a high voltage of 10 V.

On the other hand, a negative voltage of −10 V is applied to the word line connected to the selection memory cell at the time of writing data, and the main data line DL corresponding to the selection memory cell is set at a potential of 3 V. Further, the selection MOSFET Qs1 on the local data line LDL connected to the selection memory cell is turned on and 3 V is applied to the drain. However, the selection MOSFET Qs2 on the local source line LSL is turned off.

Further, a read voltage Vr (e.g., 2.0 V) is applied to the word line connected to the selection memory cell at the time of reading data and the main data line DL corresponding to the selection memory cell is precharged at 1 V. Moreover, the selection MOSFET Qs1 on the local data line LDL connected to the selection memory cell is turned on. Then, the selection MOSFET Qs2 on the local data line LDL connected to the selection memory cell is turned on and supplied with the grounding potential (0 V). Thus, a transistor through which current flows in response to the threshold voltage of the memory cell (the LDL potential is reduced to 0 V) is distinguished from another through which no current flows (the LDL potential is kept at 1 V), whereby the information stored in the memory cell is read out.

Figure 19:
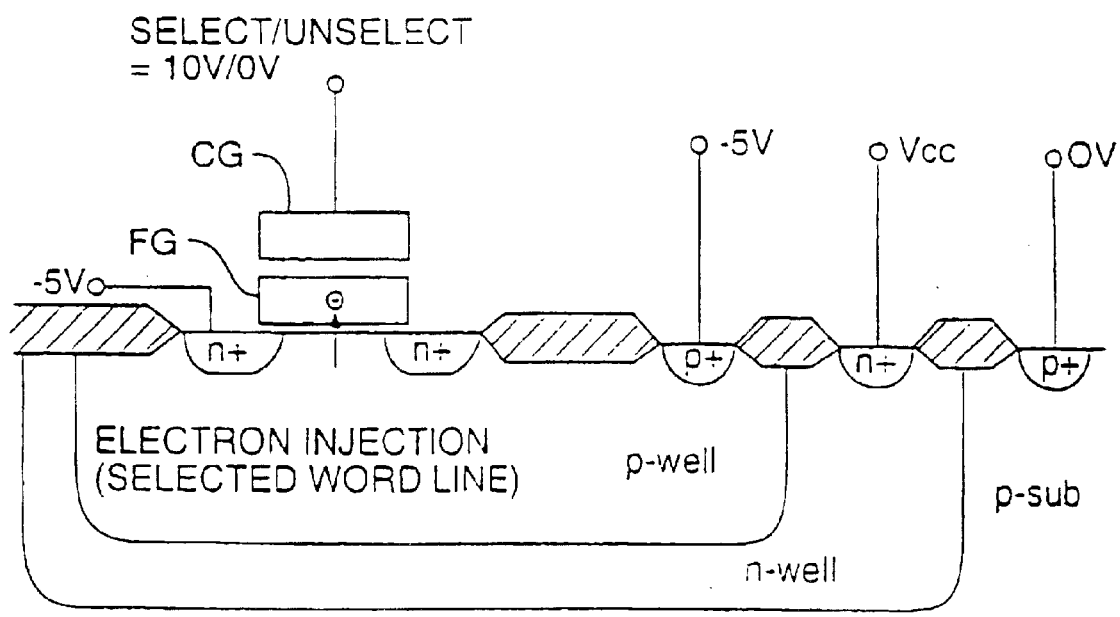
FIG. 19 is a sectional view showing an example of applied voltage at the time of erasing a memory cell in a flash memory.
Figure 24A:
FIGS. 24(a)–24(f) explain the variation in the threshold of a memory cell in the flash memory of FIG. 11.
Figure 24B:
Figure 24C:
Figure 24D:
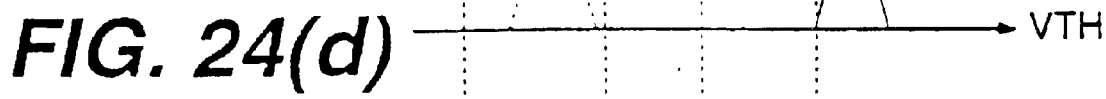
Figure 24E:
Figure 24F:
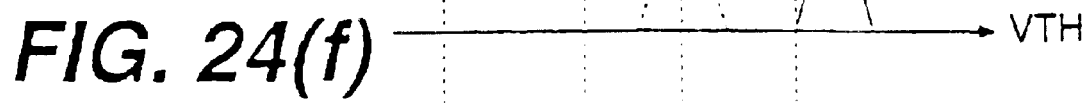

The voltage at the time of writing and erasing data is lower than the voltage in the conventional types of FIGS. 18–19 because of the reduced element dimensions attained by the use of not only a microprocessing technique, but also the 3 V source voltage Vcc instead of the conventionally employed 5 V.

To one end of the main data line DL (on the central side of the memory array), a sense latch circuit SLT is connected for detecting the data line level at the time of reading, and for applying a potential corresponding to write data at the time of writing. A data inverting circuit WRW forms expected value data at the time of additional writing. The sense latch circuits (sense amplifier with latching function) SLT constitutes the data register 12 in FIG. 1, and the data inverting circuits WRW constitute the rewrite circuit 13. The two memory arrays formed in the two WELLs are called memory mat a (MATa). In this case the number of main data lines and SLTs are made to correspond to one sector; for example, 4224 (512+16 bytes) of them are provided in parallel.

Since two memory mats constitute the memory array according to this embodiment of the invention, the data inverting circuit WRW and a memory mat b (MATb) (not shown) are arranged on the opposite side of the sense latch circuit SLT, that is, in the lower side of FIG. 2, and each main data line DL within the memory array is connected via the corresponding data inverting circuit WRW to the other input/output terminal of the sense latch circuit SLT. In other words, WRW is provided in each of MATa and MATb (called WRWa, WRWb when distinguished from each other), and SLT is commonly used by the two memory mats.

Figure 3:
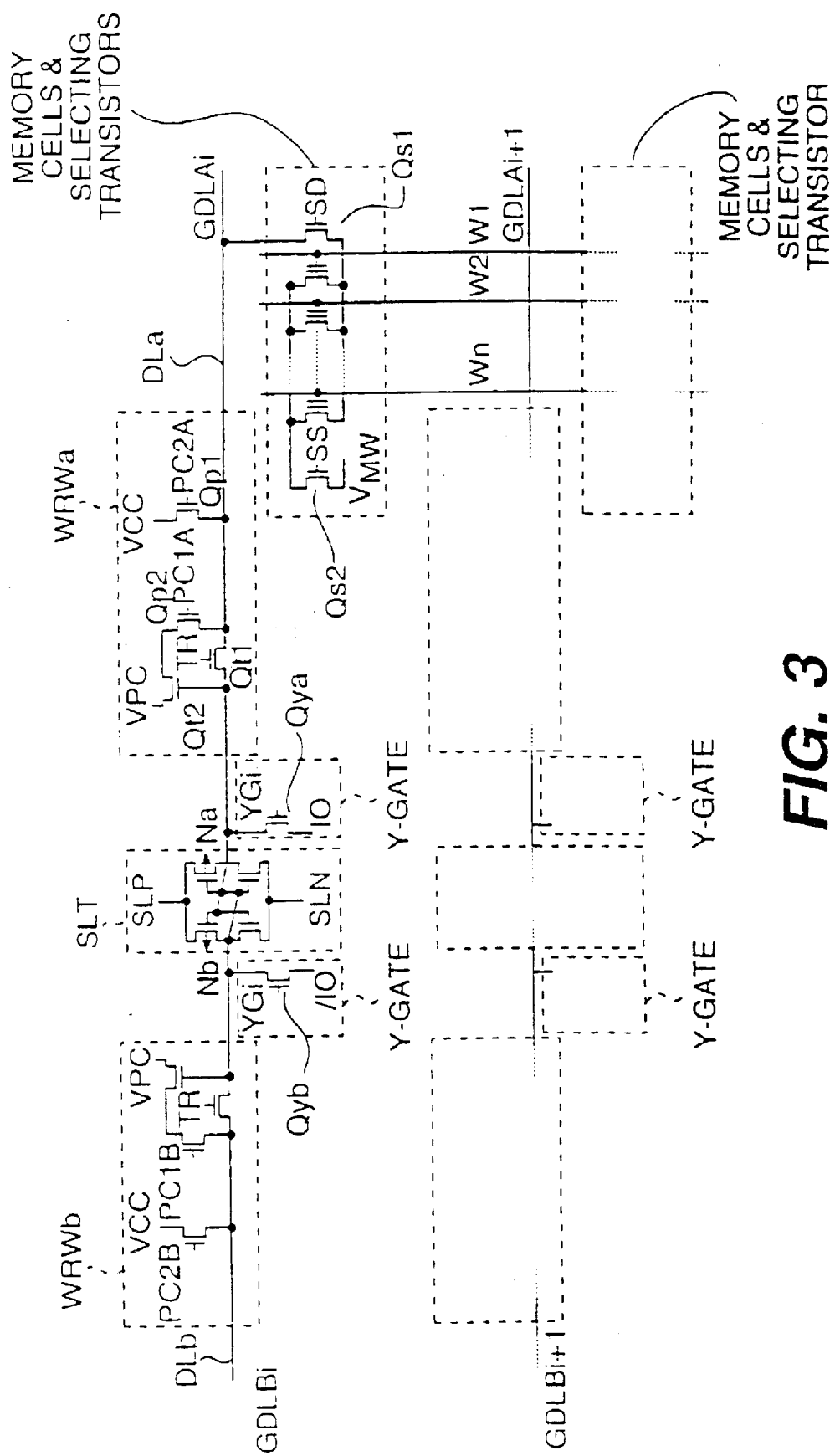
FIG. 3 is a circuit diagram showing specific examples of a sense latch circuit SLT and a data inverting circuit WRW.

FIG. 3 is a circuit diagram showing specific examples of the sense latch circuit SLT and the data inverting circuit WRW. Although there are shown one data line within the memory mat on one side and only one memory train MCC connected to the data line for convenience of explanation (because the circuit is symmetrical about the sense latch circuit), actually a plurality of memory trains MCC are connected thereto. As shown in FIG. 3, the sense latch circuit SLT is formed with a flip-flop circuit resulting from cross-linking the input/output terminals of two CMOS inverters each having P-channel and N-channel MOSFETs. Further, column switches MOSFET Qya, Qyb forming "Y gates", which are on/off controlled by the output of the Y-decoder, are connected to a pair of input/output terminals Na, Nb of the aforementioned sense latch circuit SLT, respectively. The other ends of the plurality of column switches provided on a main data line basis are commonly connected to complementary common input/output lines (IO, /IO).

The data inverting circuit WRWa includes a transmission MOSFET Qt1 connected between one input/output terminal Na of the sense latch circuit SLT and a main data line DLa within the memory mat on one side, a precharge MOSFET Qp1 which is connected between the source voltage terminal Vcc and the main data line DLa and controlled by a control signal PC2A, and MOSFETs Qt2, Qp2 connected between a precharge switching terminal VPC and the main data line DLa in series. The potential of the input/output terminal Na of the sense latch circuit SLT is applied to the gate of Qt2, whereas a control signal PC1A is applied to the gate of Qp2. Moreover, the source voltage Vcc or Vss is supplied to the precharge switching terminal VPC.

To the other input/output terminal Nb of the sense latch circuit SLT, a data inverting circuit WRWb including the MOSFETs Qt1, Qt2, Qp1, Qp2 arranged likewise is connected.

Figure 4:
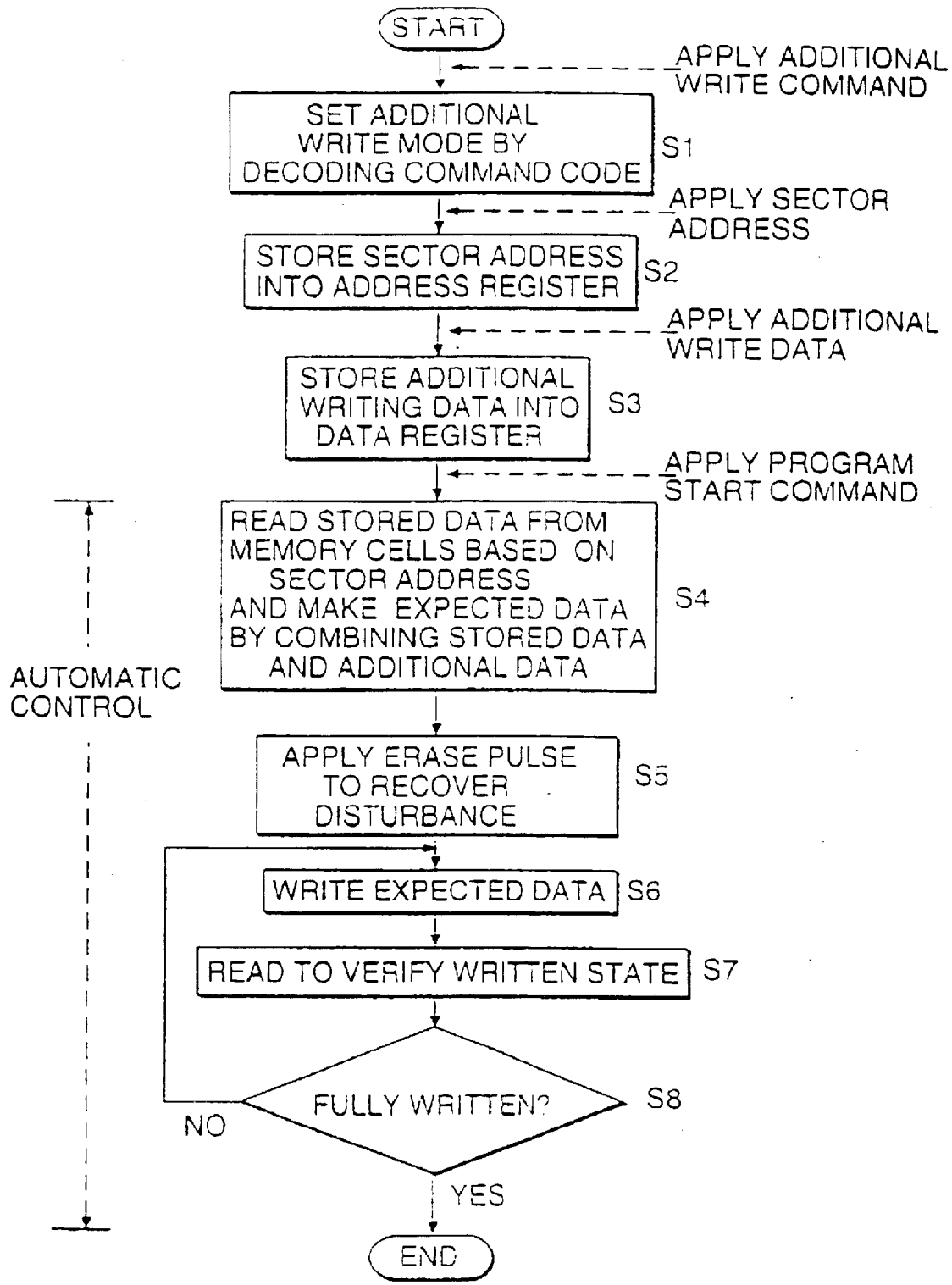
FIG. 4 is a flowchart showing an additional writing procedure for a flash memory according to an embodiment of the invention.

FIG. 4 shows a control procedure at the time of writing additional data by means of the control circuit 22. An additional write command for starting the additional writing is designated by an 8-bit code set as a command fed from the input/output terminal when the command enable signal CDE of FIG. 1 is made effective. As will be described later, though the control circuit accepts an erase and a write command additionally, these commands are distinguished by a difference in code. The command numerical value is decoded by a command decoder and a series of programs corresponding thereto are started.

The control sequence is started when the additional write command is taken in by the command register & decoder 21. When the control sequence is started, an additional write mode is set up in the chip and "1" is set in the whole sense latch circuit SLT of the data register 12 (Step S1). Subsequently, the write address fed from the outside is stored in the address register 14 (Step S2). Then at least one additional write data fed from the outside is stored in the data register 12 (Step S3).

When the write starting command is received in the command register & decoder 21 from the outside, further, a sector address (X-address) held in the address register 14 is decoded by the X-decoder 15, and one word line in the memory array 11 is selected and set at a read level of 2 V. Thus, data equivalent to one sector are read out into the data register 12, and write expected value data are created on the basis of the additional write data and held in the data register 12 (Step S4). The processing stated above is automatically performed by the rewrite circuit 13 (data inverting circuit WRW) under the control of the control circuit (sequencer) 22.

Subsequently, 10 V and an erase pulse of −3 V are applied to the selection word line and the well region, respectively, so that the threshold of all memory cells of the sector involved is raised to attain the erased state (Step S5). Thus, the stored data having "0" in the memory cell is changed to "1" as the threshold is raised to Vev or greater as shown in FIG. 10(e), and disturbance is recovered in the memory cells with the stored data having "1" as shown in FIG. 10(c). In this case, the disturbance related to the memory cells where the stored data are "1" has been caused when another memory cell in the same sector has been written.

Although there has been shown an example of raising the threshold of all memory cells of the sector to Vev or greater at Step S5 of FIG. 4, the present invention is not limited to this example, but is, as shown in FIG. 23(e), applicable to a case where the threshold of the memory cells with data already written thereto in the sector is raised to the extent that it exceeds voltage Pcv.

The operation of not collectively raising the threshold of all memory cells of the sector to the voltage Vev but raising it close to the high potential side is called pseudo-erasing for convenience of explanation. When compared with the operation of collectively erasing all memory cells of the sector, the pseudo-erasing is distinguished by the voltage application time from the former, though the voltage applied to the memory array is similar. In other words, 10 V is applied to the selection word line normally for 1 ms in order to completely erase the memory cells in the written state by executing an erase command as described in FIG. 14 later, whereas in the case of the pseudo-erasing, approximately 0.1 ms, which is about $\frac{1}{10}$, is considered to be satisfactory.

Therefore, the threshold voltage of the first memory cell group in the second state within one sector is not completely changed up to the threshold voltage in the first state but remains in between the first and second state. Moreover, the threshold voltage of the second memory cell group in the first state, as the remainder of the first memory cell group in the same sector, is changed in the voltage direction in which the threshold voltage is gradually raised (i.e., the voltage direction in which the second state of the threshold voltage is changed to the first state). More specifically, the pseudo-erasing operation is not intended to erase the memory cell completely, but to change the threshold voltage in the opposite voltage direction to the extent that the change is offset in expectation of variation in the threshold voltage in the voltage direction from the first state to the second state caused by word disturbance.

Then the selection word line is set at −10 V and the data line uses the expected value data created at Step S4 and held in the data register (sense latch SLT) 12 to selectively set the voltage level of LDL at 3 V, and writes data to the above erased sector (Step S6). The voltage level of LDL that is not written is set at 0 V. Then, verify voltage Vepv is used for reading and determining whether or not the threshold has been lowered sufficiently, by deciding whether the data held in the data register 12 have been totally set to "0" (Step S7). If any "1s" are left, the presence of a high-threshold memory is decided and Step S6 is followed again, whereupon the data then held in the data register 12 are used to repeat the verifying operation again.

During the process of repeating the verifying operation, the memory cells whose threshold has been lowered sufficiently (the threshold voltage is lower than the verify voltage Vpv) are arranged so that they are prevented from being written with the voltage level of LDL set at 0 V. Then the remaining memory cells whose threshold has not been reduced sufficiently are selectively written and, when the threshold voltage of the memory cell group to be written is totally sufficiently lowered, rewriting and verifying are suspended.

The write verify corresponds to a variation in writing time of the memory cells in the same sector. In other words, the memory cells set at the threshold in the first and second states because of the pseudo-erasing have write times far shorter than that of the memory cell whose threshold is changed from the first state to the second state. With the use of write verify, variation in the threshold voltage at the time of writing is suppressed and the threshold voltage is effectively prevented from becoming Vss or lower.

FIGS. 5–8 show signal timings in each component of the memory array and the data inverting circuit WRW in detail at the time of generating the write expected value data at Step S4 in the additional writing flow described above. FIGS. 5–8 show signal timings for the right-hand side memory mat MATa in the memory array shown in FIG. 3. Further, Table 1 shows variation in the data held in the data register 12 and the data line level during the process of generating the aforementioned write expected value data in the order of time from up to down.

MOSFET Qt2 is turned on when the data held in the sense latch SLT is "1" and turned off when it is "0". Therefore, the main data line DLa corresponding to "1" of the data held in the sense latch SLT is precharged at 1 V and the main data line DLa corresponding to "0" of the data thus held is set at Vss (low level). Since the data "1" has been set in the sense latch SLT corresponding to the memory cell not to be additionally written (the memory cell to which data has already been written), the corresponding main data lines DLa are totally precharged at 1 V.

Subsequently, one word line, a local drain selection signal SD, and a local source selection signal SS are caused to rise, and the selection MOSFET Qs1 in the memory array is turned on (timing t2 of FIG. 5), whereby since the memory cells (low threshold) with data "0" already written is turned on, the corresponding main data line DLa is discharged and set at the low level. On the other hand, the corresponding main data line DLa remains at the high level since the memory cells (high threshold) with stored data of "1" are turned off. Further, since the unwritten (in the erased state) memory cells (high threshold) are turned off, the main data line DLa corresponding to additional write data of "1" held in the sense latch SLT is set at 1 V, and the main data line DLa corresponding to additional write data of "0" is set at Vss.

Subsequently, the source voltages SLP, SLN of the sense latch SLT are reset (SLP=SLN=0.5 V) and the data thus held is canceled once (timing t3 of FIG. 5). Then a signal TR is set at the high level and the transmission MOSFET Qt1 on the data line is turned on so as to transfer the potential of the data line to the sense latch SLT (timing t4 of FIG. 5). Further, the source voltages of the sense latch SLT are put in a

TABLE 1

|  | UNUSED | | | | | | | | USED | | | | | |
|---|---|---|---|---|---|---|---|---|---|---|---|---|---|---|
| MEMORY DATA | 1 | 1 | 1 | 1 | 1 | 1 | 1 | 1 | 1 | 0 | 1 | 0 | 1 | 0 |
| ADDITIONAL DATA | 1 | 0 | 0 | 1 | 0 | 0 | 1 | 0 | — | — | — | — | — | — |
| DATA LINE & REGISTER | | | | | | | | | | | | | | |
| t1 | H | L | L | H | L | L | H | L | H | H | H | H | H | H |
| t2 | H | L | L | H | L | L | H | L | H | L | H | L | H | L |
| t5 | 1 | 0 | 0 | 1 | 0 | 0 | 1 | 0 | 1 | 0 | 1 | 0 | 1 | 0 |
| t6 | H | H | H | H | H | H | H | H | H | H | H | H | H | H |
| t7 | L | H | H | L | H | H | L | H | L | H | L | H | L | H |
| t10* | 0 | 1 | 1 | 0 | 1 | 1 | 0 | 1 | 0 | 1 | 0 | 1 | 0 | 1 |

*Expected data

As shown in Table 1, the additional write data are stored in the predetermined bits of the data register (sense latch SLT) 12. As described above, data "1" (i.e., the threshold is not varied at this stage) is set in the sense latch SLT corresponding to the memory cell not to be additionally written (the memory cell to which data has already been written) in the same sector. In other words, though the item of additional data in a column being used is shown by "-" in order to make it clear that no addition writing is made in Table 1, the time is actually "1". Moreover, Vcc (high level) is initially supplied to the voltage source selector terminal VPC in the data inverting circuit WRW.

Figure 5:
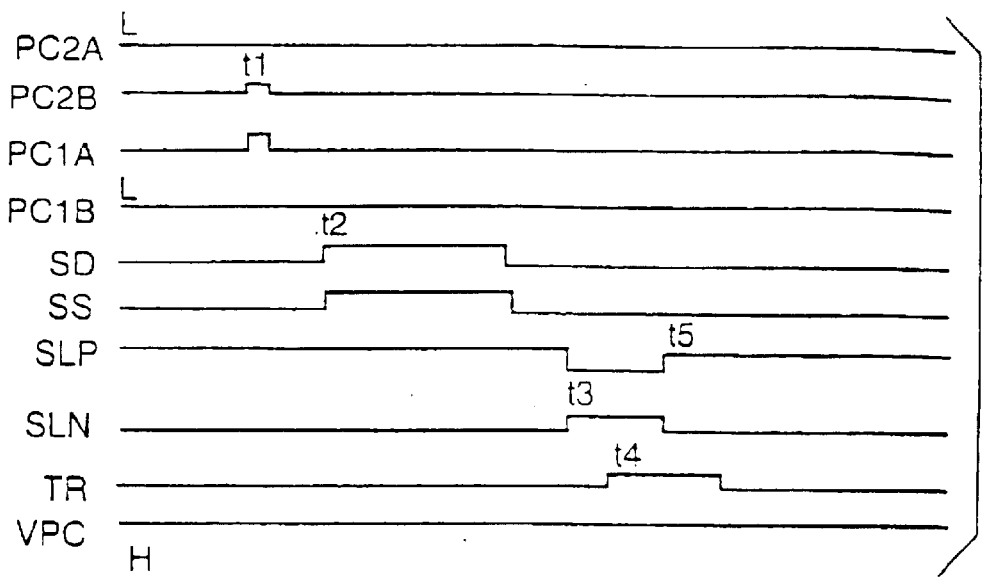
FIG. 5 is a timing chart showing signal timing in the memory array at the time of additional writing (first half) in a flash memory according to an embodiment of the invention.
Figure 6A:
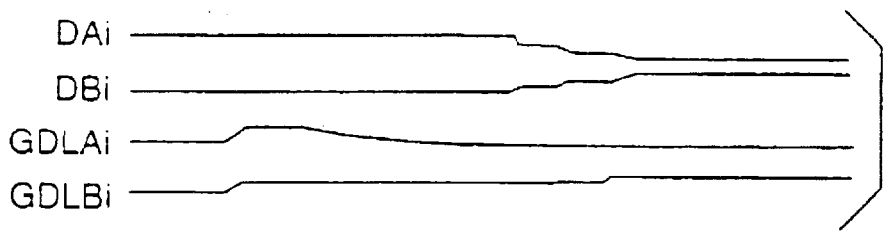
FIGS. 6(a)–6(c) are waveform charts showing sense latching at the time of additional writing (first half) and a data line level displacement in a flash memory according to an embodiment of the invention.
Figure 6B:
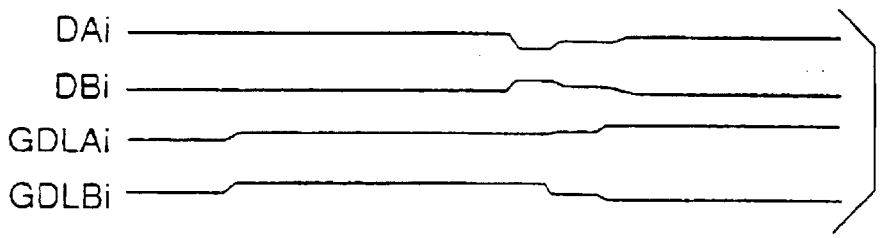

As shown in FIG. 5, signals PC2B, PC1A are first caused to rise (t1) in that state, whereby the MOSFET Qp1 in the data inverting circuit WRW in MATb on the non-selection side is turned on, so that a plurality of main data lines DLb are precharged at a reference potential (e.g., 0.5 V). On the other hand, the MOSFET Qp2 in the data inverting circuit WRW in MATa on the selection side is turned on and the forward bias state to amplify the potential of the data line (timing t5 of FIG. 5). FIGS. 6(a)–6(b) show variation in the input/output node of the sense latch SLT and potential of the main data lines DLa, DLb when the aforementioned signal timing is followed.

Figure 6C:
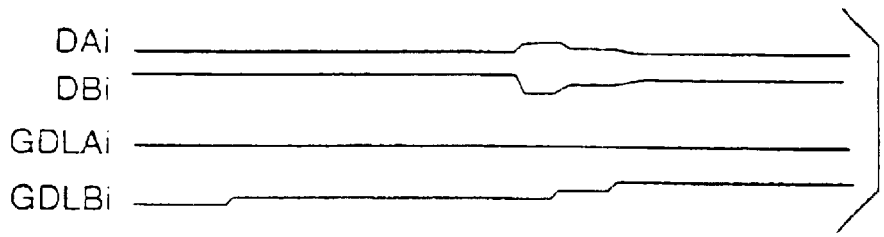

In FIGS. 6(a)–6(c), symbol DAi represents the potential of the input/output node Na on the mat MATa (the right-hand mat in FIG. 3) side of the sense latch SLT; DBi, the potential of the input/output node Nb on the mat MATa (the left-hand mat, not shown in FIG. 3) side of the sense latch SLT; GDLAi, the potential of the main data line DLa on the mat MATa; and GDLBi, the potential of the main data line DLb on the mat Matb. Further, FIG. 6(a) shows waveforms in a case where the present state of the selection memory cell is the written state (low threshold); FIG. 6(b) shows waveforms in a case where the present state of the erased state (high threshold) and no data is written by additional writing; and FIG. 6(c) shows waveforms in a case where the present state of the selection memory cell is the erased state (high threshold) and data is written by additional writing.

Figure 7:
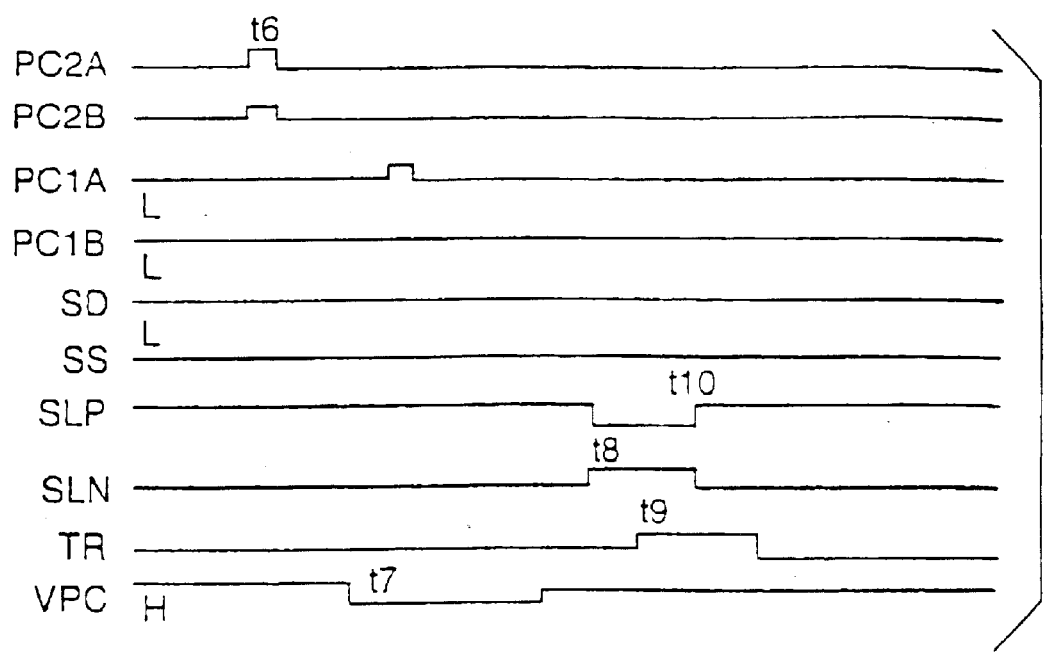
FIG. 7 is a timing chart showing signal timing in the memory array at the time of additional writing (second half) in a flash memory according to an embodiment of an invention.

As shown in FIG. 7, the signal TR is set at the low level and the transmission MOSFET Qt1 is turned off to cause signals PC2A, PC2B to rise (timing t6) in such a state that the data line is cut off from the sense latch SLT. At this time, the MOSFET Qp1 in the data inverting circuit WRW is turned on and the main data lines DLa, DLb are precharged at 1 V and 0.5 V, respectively. Then the voltage source selector terminal VPC in the data inverting circuit WRW is switched over to Vss and the signal PC1A is caused to rise (timing t7 of FIG. 7).

Further, the MOSFET Qp2 in the data inverting circuit WRWa is turned on at the selection side, and the MOSFET Qt2 is turned on in response to the data "1" held in the sense latch SLT and turned off in response to the data "0". Therefore, the main data line DLa corresponding to the data "1" held in the sense latch SLT is discharged to Vss (low level) and the main data line DLa corresponding to the data "0" held therein is left at 1 V (high level). In other words, a state in which the date held in the data register 12 is inverted appears on the data line on the selection side.

Subsequently, the source voltages SLP, SLN of the sense latch SLT are reset and the data thus held is canceled once (timing t8 of FIG. 7). Then a signal TR is set at the high level and the transmission MOSFET Qt1 on the data line is turned on so as to transfer the potential of the data line to the sense latch SLT (timing t9 of FIG. 7). Further, the source voltages of the sense latch SLT are put in a forward bias state to amplify the potential of the data line (timing t10 of FIG. 7). Thus, write expected value data, reduced to "1" only by the sense latch SLT corresponding to a memory cell to be written, is held in the data register 12. The write expected value data will readily be understood from Table 1 as being prepared by arranging additional write data and the data stored in the memory cell already written, and inverting the combination.

In the flash memory according to this embodiment of the invention, while the write expected value data is held in the data register 12, all the memory cells in the sector involved are put in the erased state (high threshold) or subjected to pseudo-erasing by applying the erase pulse to the selection word line and the well area in such a state that the transmission MOSFET Qt1 on the data line has been turned off. Then the write expected value data held in the data register 12 are used to carry out desired additional writing by precharging only the data line with the held data "1" at a level of 3 V so as to apply −10 V to the selection word line. Consequently, the threshold of the memory cell that has not been connected to the precharged data remains unchanged and the stored data becomes "1", whereas the threshold of the memory cells connected to the precharged data are lowered, whereby the stored data becomes "0".

In this case, the erase time can be curtailed because the threshold of the memory cell in the erased state at the time the erase pulse is applied need only exceed the minimum write verify voltage.

Figure 8A:
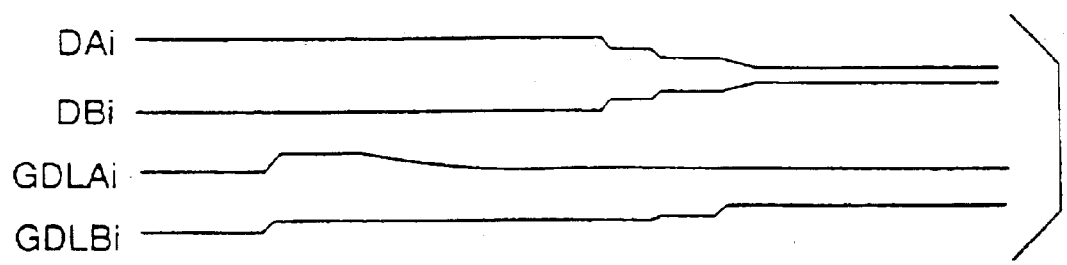
FIGS. 8(a)–8(b) are waveform charts showing sense latching at the time of additional writing (second half) and a data line level displacement in a flash memory according to an embodiment of the invention.
Figure 8B:
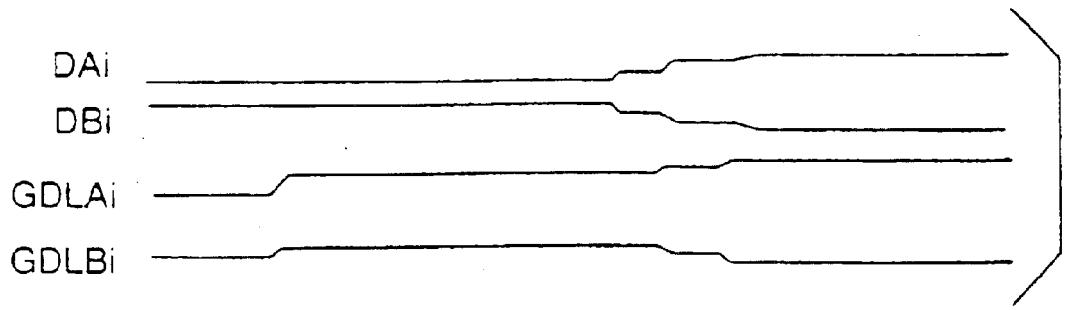

FIGS. 8(a) and 8(b) show variation in the input/output node of the sense latch SLT and the potential of the main data lines DLa, DLb when the aforementioned signal timing is followed. FIG. 8(a) shows waveforms after a case where the potential of the matA-side input/output node of the sense latch SLT remains at the high level on the termination of the operation of FIG. 5 (timing t5), and FIG. 8(b) shows waveforms after a case where the potential of the matA-side input/output node of the sense latch SLT remains at the low level on the termination of the operation of FIG. 5 (timing t5).

Figure 9A:
FIGS. 9(a)–9(c) explain the variation in the threshold of a memory cell at the time of additional writing in a flash memory according to an embodiment of the invention.
Figure 9B:
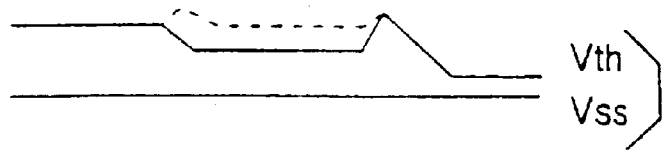
Figure 9C:
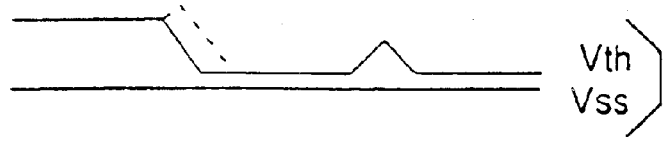

FIGS. 9(a)–9(c) show the state of variation in the threshold before and after additional writing to each memory cell. FIG. 9(a) shows variation of the memory cell in the prior-to-write state in which additional write data is "1" at 'erasing (stored data "1")' is "1"; FIG. 9(b) variation of the memory cell in the prior-to-write state in which additional write data at 'erasing (stored data "1") is "0"'; and FIG. 9(c) variation of the threshold of the memory cell in the prior-to-write state in which additional write data is absent at 'writing (stored data "1" is "0")'. In FIGS. 9(a)–9(c), the gentle slope tilting toward the right means a reduction in threshold due to disturbance. Those shown by a broken line in FIGS. 9(a)–9(c) refer to variation in the threshold in a case where the initial writing has also been carried out by the use of the additional write command. In other words, writing using the additional write command is effective since disturbance occurs even in the case of writing immediately after the single sector erasing of the memory cell.

Table 2 shows the relation among the state of the memory cell (stored data), additional write data, and the write expected value data. Symbols A, B, C in Table 2 represent corresponding variations in the threshold of the memory cell in FIGS. 9(a)–9(c)

TABLE 2

|  | STATE OF THE MEMORY CELL | ADDITIONAL WRITE DATA | WRITE EXPECTED VALUE DATA |
|---|---|---|---|
| UNUSED |  |  |  |
| (A) | ERASE ("1") | 1 | 0 (NO WRITE) |
| (B) | ERASE ("1") | 0 | 1 (WRITE) |
| USED |  |  |  |
| (C) | WRITE ("0") | — | 1 (WRITE) |
| (A) | ERASE ("1") | — | 0 (NO WRITE) |

FIGS. 10(a)–10(f) show variation in the threshold of each memory cell by applying additional write control according to this embodiment of the invention. FIGS. 10(a)–10(f) collectively show a diagram illustrating a transition state of the threshold of a memory cell group in one sector with the X-axis representing voltage and the Y-axis representing the degree of a memory cell at a specific threshold voltage.

In FIGS. 10(a)–10(f), a first state of the threshold voltage (erased state, logical state "1") and a second state thereof (written state, logical state "0") are defined. More specifically, the threshold voltage of the memory cell for determining the storage state of the memory cell is Vev or higher in the first state, and ranges from Vss to Vpv in the second state, in either case of which it is not a voltage at having a specific value, but falls within a predetermined range (Vss to Vpv). According to this embodiment of the invention, as shown in FIGS. 10(a)–10(c), the threshold of the memory cell whose threshold has lowered, as shown by a broken line due to disturbance at the time of initial writing, can be recovered.

Although a detailed description has not been given before, if a specific memory cell group is written after one sector is subjected to single-sector erasing, the remaining memory cells undergo word disturbance from the beginning. FIGS. 10(a) and 10(b) show variation in the threshold in a case where the first memory cell group (in the erased state) is not written in an unused area where the threshold voltage is in the first state within the same sector, and FIGS. 10(c) and 10(d) show variation in the threshold in a case where the first memory cell group is written in that unused area. Moreover, FIGS. 10(e) and 10(f) show variation in the threshold of the second memory cell group in which the threshold voltage in a usable area is in the second written state. As is obvious from these figures, even the written memory cell is put in the erased state once before being put in the written state according to this embodiment of the invention.

Although a description has been given of a case where the sector is divided into a usable and an unused area in the above embodiment of the invention, the present invention is not limited to that case but may be implemented so that the above unused area is divided into a plurality of sections to make additional writing possible on a section basis.

Further, although a description has been given of a flash memory system in which the threshold is lowered with a write pulse after performing the erasing operation once to raise the threshold at the time of writing data according to the above embodiment of the invention, such a system may raise the threshold with the write pulse after lowering the threshold of the memory cell through the erasing operation.

The flash memory formed on one chip as shown in FIG. 1 according to the first embodiment of the invention includes at least a read command (shown in FIG. 13), the erase command (FIG. 14) for collectively putting the threshold voltage of memory cells in one sector in the first state, and the write command (FIG. 15—first write-command) in addition to the additional write command (second write command). A detailed description will be given of procedures of FIGS. 13–14 later. It takes about 1 ms to change the memory cell group in one sector from the second state in threshold to the first state by executing the erase command. It also takes about 1 ms to change the memory cell group from the first state in threshold to the second state by executing the write command.

The function and the effect of the present invention are achieved according to the above embodiment as follows: When the additional write command of FIG. 4 is compared with the write command first, the additional write command features a procedure at Steps S4–S5. Synthesizing final write data at Step S4 automatically contributes to saving write time.

Figure 14:
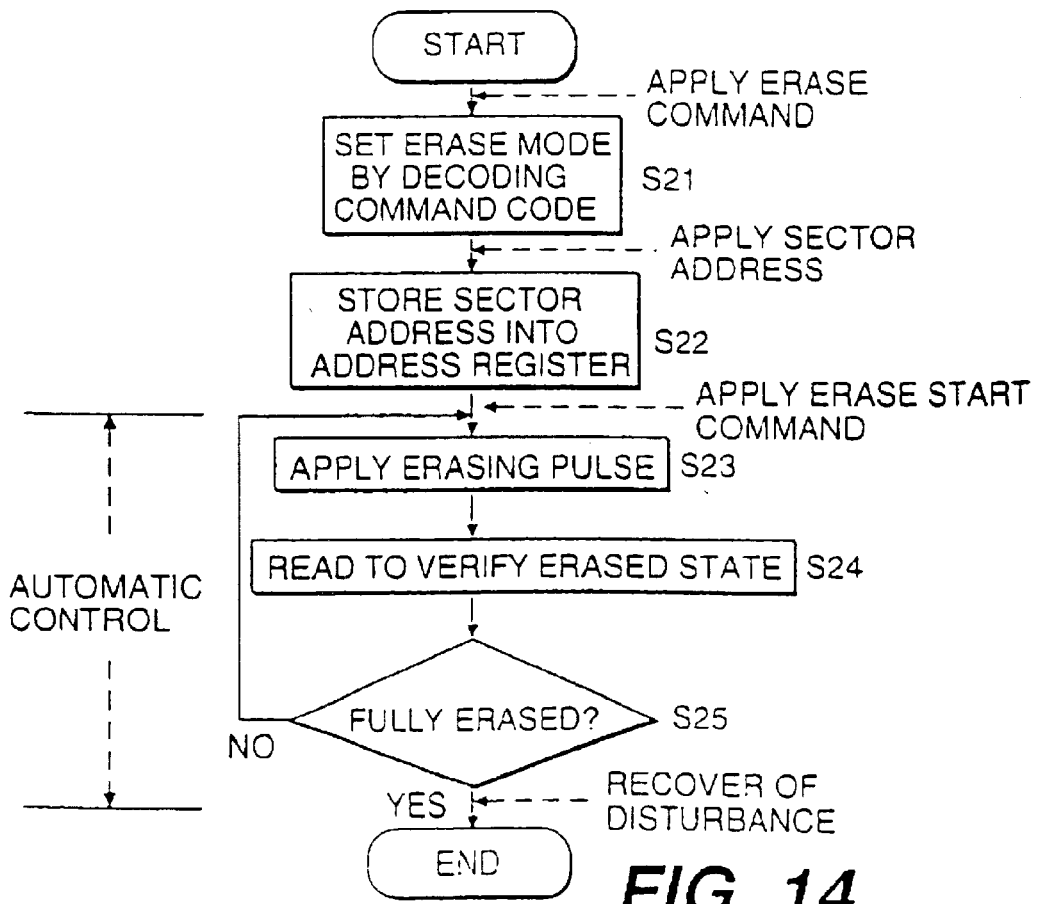
FIG. 14 is a flowchart showing a second-stage erase command executing procedure for explaining a second flash memory embodying the present invention.
Figure 15:
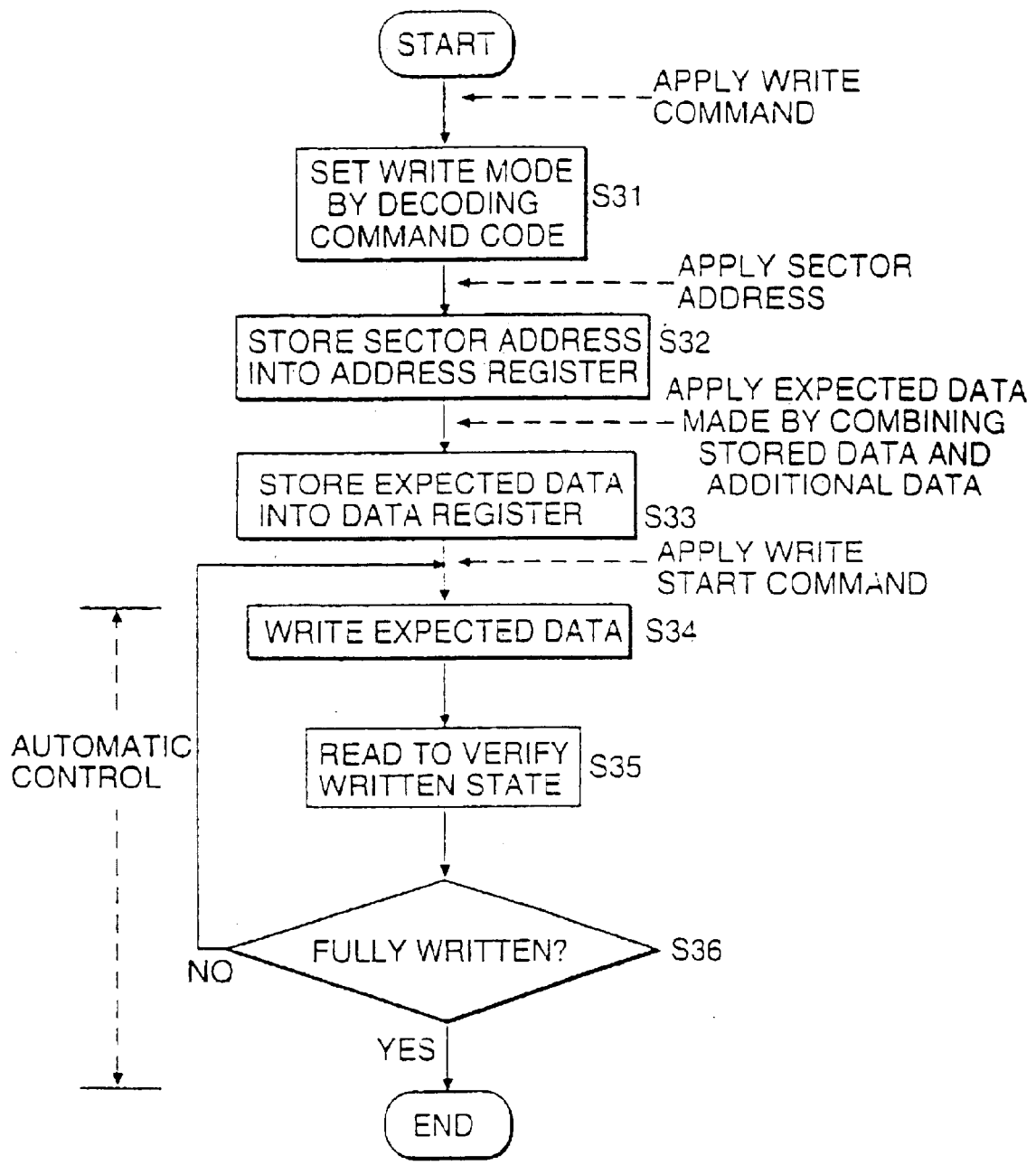
FIG. 15 is a flowchart showing a third-stage write command executing procedure for explaining a second flash memory embodying the present invention.

A comparison made in terms of the voltage applied to the word line, which characteristically determines the voltage direction of the threshold voltage, includes a step of applying only +10 V for about 1 ms with the erase command of FIG. 14, and a step of applying only −10 V for about 1 ms with the write command of FIG. 15. Moreover, it is featured that a step of applying −10 V which is followed by applying +10 V is taken in reference to FIG. 4. Further, the time required to apply +10 V in the case of pseudo-erasing at Step S5 is far shorter than the time required to apply +10 V with the erase command.

In the method of saving write data of one sector in SLT once, subjecting the memory cell to complete single sector erasing (about 1 ms) with the erase command, and then writing (about 1 ms) the final write data synthesized from the data saved in SLT and new write data with the write command in order to avoid disturbance, requires a total of about 2 ms or more. On the other hand, the use of the additional write command using the pseudo-erasing results in completing the writing operation in about 1.1 ms, or about half the time, as writing is effected (about 1 ms) after the pseudo-erasing (about 0.1 ms). Since the disturbance is compensated for by the pseudo-erasing, the additional write command makes it unnecessary to completely erase the sector by executing the erase command prior to executing the additional write command, as is required by the conventional system.

Further, since the word disturbance is greatly eased, the additional write command may be executed many times without executing the erase command. Even when the additional write command is continuously executed about 15 times or more without executing the erase command, the data stored in the same sector remains assured. The continuous repetition of erasing-writing 15 times requires about 30 ms according to the prior art, whereas the continuous execution of the additional write command 15 times, plus only one erase command, total 17.5 ms, so that the write time according to the invention is much shorter.

<Embodiment 2>

Figure 11:
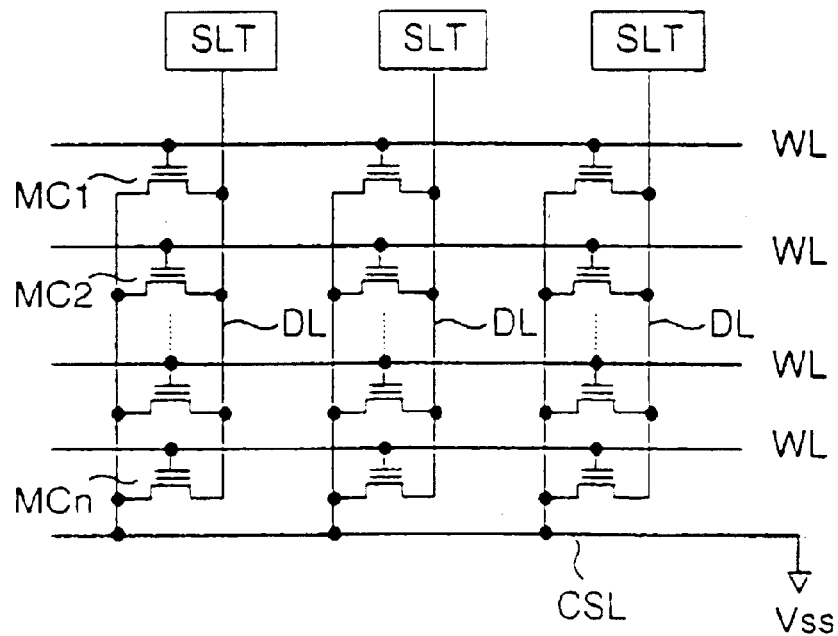
FIG. 11 is a circuit diagram showing another memory array of a flash memory according to the present invention.

FIG. 11 shows a memory array of the aforementioned system for increasing the threshold using the write pulse.

The difference between the memory array according to this embodiment of the invention and the memory array (see FIG. 2) according to the preceding embodiment lies in the direct connection of the drains of memory cells MC1–MCn to respective main data lines DL, omitting selection MOSFETs Qs1, Qs2, and the connection of the sources of the memory cells MC1–MCn to a common source line CSL. However, both the memory arrays are similar in that a line of memory cells are connected in parallel.

Moreover, in the memory array according to this embodiment of the invention, the definition of the threshold voltage of the memory cell at the time of writing and erasing data is opposite to what is given in the embodiment thereof in FIG. 2. The memory array shown in FIG. 11 may be called a NOR-type flash memory, although the array is not so limited. At this time, the injection of electrons into the floating gate (to raise the threshold voltage to attain the written state) uses, though not so limited, CHE (Channel Hot Electron) injection from the drain of the transistor, and FN tunnel emission for drawing electrons from the floating gate (to lower the threshold voltage to attain the erased state).

According to this embodiment of the invention, as shown in Table 3, a voltage as high as 10 V is applied to the control gate CG, whereas the grounding potential (0 V) is applied to the source. On the other hand, different voltages depending on selection/non-selection are applied to the drain. In other words, a voltage of 5 V is applied to the drain of the selection memory cell to turn it on to put the memory cell in the ON state, thus causing current to flow across the source and drain, and the hot electrons generated then are injected into the floating gate, thereby raising the threshold of the memory cell for writing. Further, 0 V is applied to the drain, like the source, of the non-selection memory cell, and the threshold of the memory cell consequently remains low because no current flows across the source and drain of the memory cell.

TABLE 3

|  | CG | DRAIN | SOURCE |
| --- | --- | --- | --- |
| WRITE | 10 | 5/0 | 0 |
| ERASE | −10 | FLOATING | 5 |
| READ | 5 | 1 | 0 |

At the time of erasing data, a negative voltage of −10 V is applied to the control gate CG, and the drain is reduced to a floating state in which no voltage is applied. Further, a positive voltage of 5 V is applied to the source, whereby electrons are drawn from the floating gate of the memory cell so as to lower the threshold of the memory cell. This erasing operation is performed by the sectors sharing the word line in common. As 5 V is applied to the control gate, 0 V to the source, and 1 V to the drain of the memory cell at the time of reading data according to this embodiment of the invention, no drain current flows through the memory cell having a high threshold, whereas the drain current flows through the memory cell having a low threshold. Consequently, data is read out by detecting the lowering of the precharge level of the data line.

If additional write control similar to that in the preceding embodiment of the invention is applied, it is also possible in this embodiment of the invention to recover the threshold of the memory cell whose threshold has risen because of disturbance at the time of initial writing as shown by broken lines in FIGS. 12(a) and 12(c). FIGS. 12(a) and 12(b) show variation in the threshold in a case where the memory cell (in the erased state) in the unused area is not written; FIGS. 12(c) and 12(d) show variation in the threshold in a case where the memory cell in the unused area is written; and FIGS. 12(e) and 12(f) variation in the threshold of the memory cell in the written state in the usable area. Thus, even the written memory cell is put in the erased state once and then in the written state again according to this embodiment of the invention. Further, FIGS. 24(a)–24(f) show that variation in the threshold of the memory cell may be set so that it is slightly lower than voltage Vpv.

In summary, in Embodiment 2, an effect similar to that of Embodiment 1 is achievable by reversing the high and low levels of threshold voltage in the first state and the second state.

<Embodiment 3>

Figure 13:
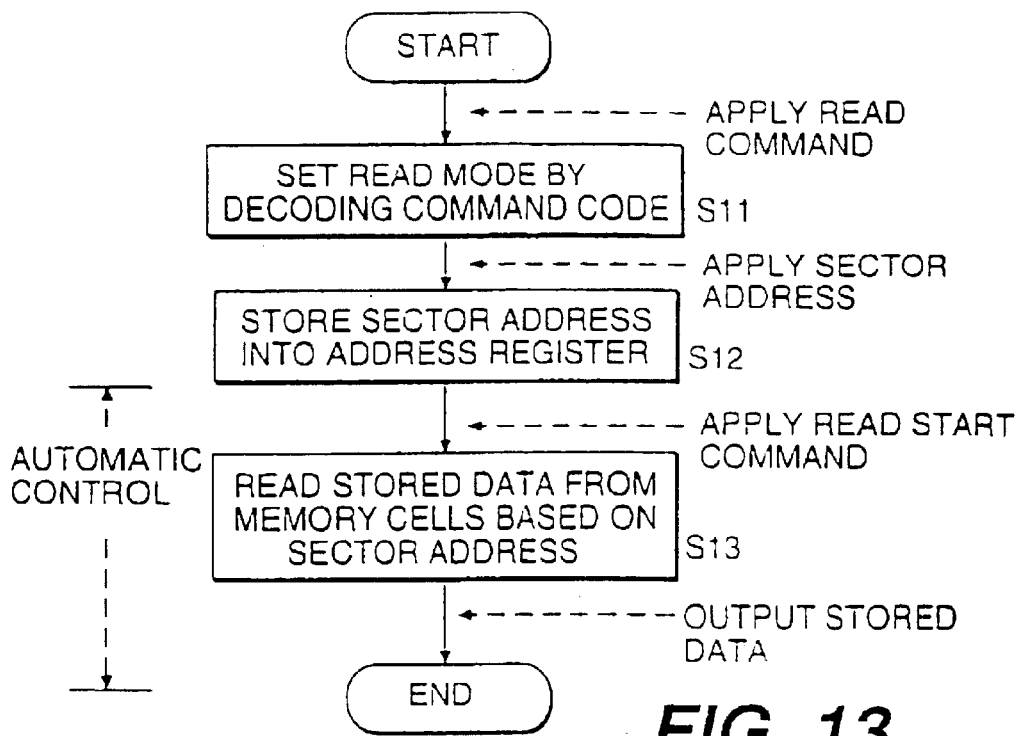
FIG. 13 is a flowchart showing a first-stage read command executing procedure for explaining a second flash memory embodying the present invention.

FIGS. 13–15 show another embodiment of the invention. According to this embodiment of the invention, a data read command, an erase command, and a write command from an external control unit are generally used for carrying out additional writing without supplying the flash memory with the additional write command and the expected value data function as in the preceding embodiment of the invention. The flash memory to which this embodiment of the invention is applicable has a sequencer that is capable of at least decoding a data read command, an erase command, and a write command as well as a start command, and executing these commands. Of these commands, the start command is not necessarily required, and the flash memory may be arranged so that it is automatically started.

A nonvolatile memory has a memory array and a sequencer which are formed on one chip and the sequencer is at least capable of executing basic instructions including a read command (FIG. 13), an erase command (FIG. 14), and a write command (FIG. 15). As described with reference to Embodiment 1, the voltage application time of the word line with the erase command and executing steps are changeable so that complete single-sector erasing and the above described pseudo-erasing can be carried out. A second erase command that is different in erase time may be provided for special use in pseudo-erasing. At this time, erase verify of the erase command is unnecessary.

The additional write command according to the present invention is in the form of a macro command for executing the three basic instructions above successively and continuously. The command may be distributable to a magnetic medium or the like as a program executable by the CPU of, for example, a personal computer. Therefore, the "sequencer" in this embodiment is a combination of a sequencer in the narrow sense of a memory chip and an external CPU.

Moreover, the additional command may be in the form of an additional program as a nonvolatile memory driver or often combined into the OS of a computer. Therefore, this embodiment can be part of a computer system having a nonvolatile memory chip capable of executing the three basic instructions, and a CPU to which the memory chip is connected.

The following description refers to FIGS. 13–15.

When additional writing is carried out according to this embodiment of the invention, a data read command is first fed from an external control unit to the flash memory and a sector address is subsequently fed. The sector address is equivalent to a location to which data is additionally written later. When the flash memory is supplied with the data read command, it sets each circuit in the memory in a read mode (Step S11 of FIG. 13). When the address is input then, it is stored in an address register (Step S12).

When a start command is input from the outside, the address data stored in the address register is read from a memory array and output externally. The external control unit stores the data that has been output from the flash memory in a predetermined save area within an external memory. Further, the external control unit creates write expected value data from the read data stored in the save area and additional write data, and holds the write expected value data in the external memory.

Subsequently, an erase command and a sector address are fed from the external control unit into the flash memory. Then the flash memory sets each circuit of the memory in an erase mode and stores the address thus input in the address register (Steps S21, S22 of FIG. 14). When the start command is input, the flash memory applies a bias voltage for establishing an erased or pseudo-erasing state to a memory cell corresponding to the sector address set by the address register so as to vary the threshold (Step S23). Then the flash memory effects a verify read to confirm whether or not the data has been erased, the process returns to Step S23 when it has not been erased yet, and applies an erase pulse to the memory cell again (Steps S24, S25). The erase verify at S23–S25 is utilized at the time of normal erasing, but is not used at pseudo-erasing.

Then the write command, the sector address and the write expected value data are successively input from the external control unit to the flash memory, whereupon the flash memory sets the write mode in each of the circuits in the memory, and stores the address thus input in the address register and the write expected value data in the data register (Steps S31, S32, S33 of FIG. 15). When the start command is input subsequently, the flash memory applies the write pulse to the memory cell corresponding to the sector address set in the address register so as to vary the threshold (Step S34). Then the flash memory effects a verify read to confirm whether or not the data has been written, and returns to Step S34 when the data has not been written, so as to apply the write pulse to the memory cell again (Steps S35, S36).

Although a description has been given of a macro additional write command as the combination of three basic instructions including the read, erase, and write commands, an effect similar to that obtainable in Embodiment 1 can be anticipated with respect to the additional writing that can be carried out by avoiding the word disturbance without executing the erase instruction. However, the effect of saving the procedure at Step S4 of FIG. 4 for outputting the write data externally from the memory chip becomes less distinct than the embodiment of FIG. 4.

Figure 16:
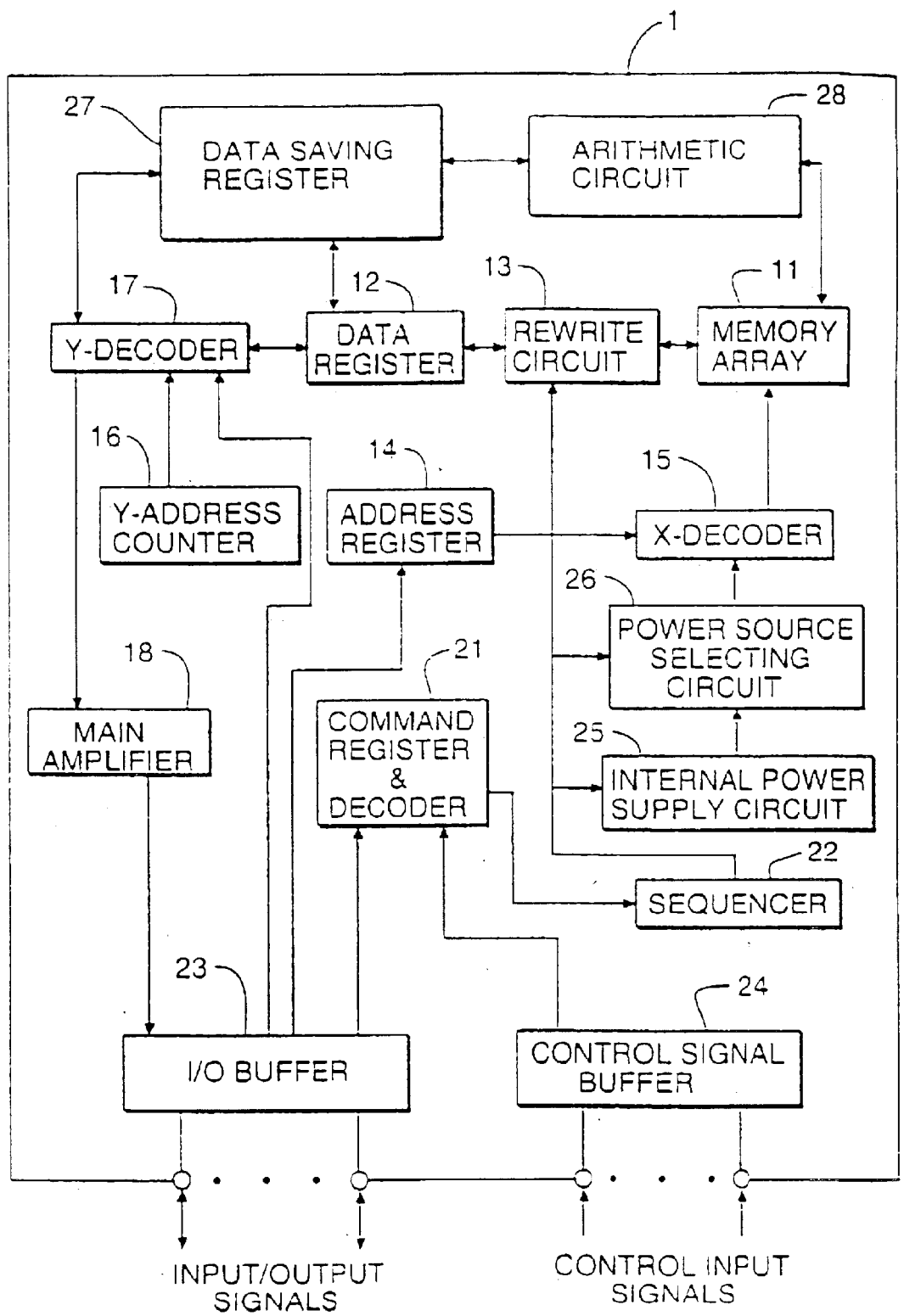
FIG. 16 is a schematic overall block diagram illustrating a third flash memory embodying the present invention.

FIG. 16 shows still another embodiment of the invention, wherein like reference numerals designate like component parts, and the repeated description thereof will be omitted. According to this embodiment of the invention, there are provided a data saving register 27 for use as the save area according to the preceding embodiment thereof, and an arithmetic circuit (corresponding to write expected value data) 28 for operating on write expected value data in the flash memory. The sequencer 22 according to this embodiment of the invention has a function of decoding an additional write command fed from an external control unit and controlling the data saving register 27 and the arithmetic circuit 28 at proper timings so as to carry out additional writing.

<Embodiment 4>

Figure 17:
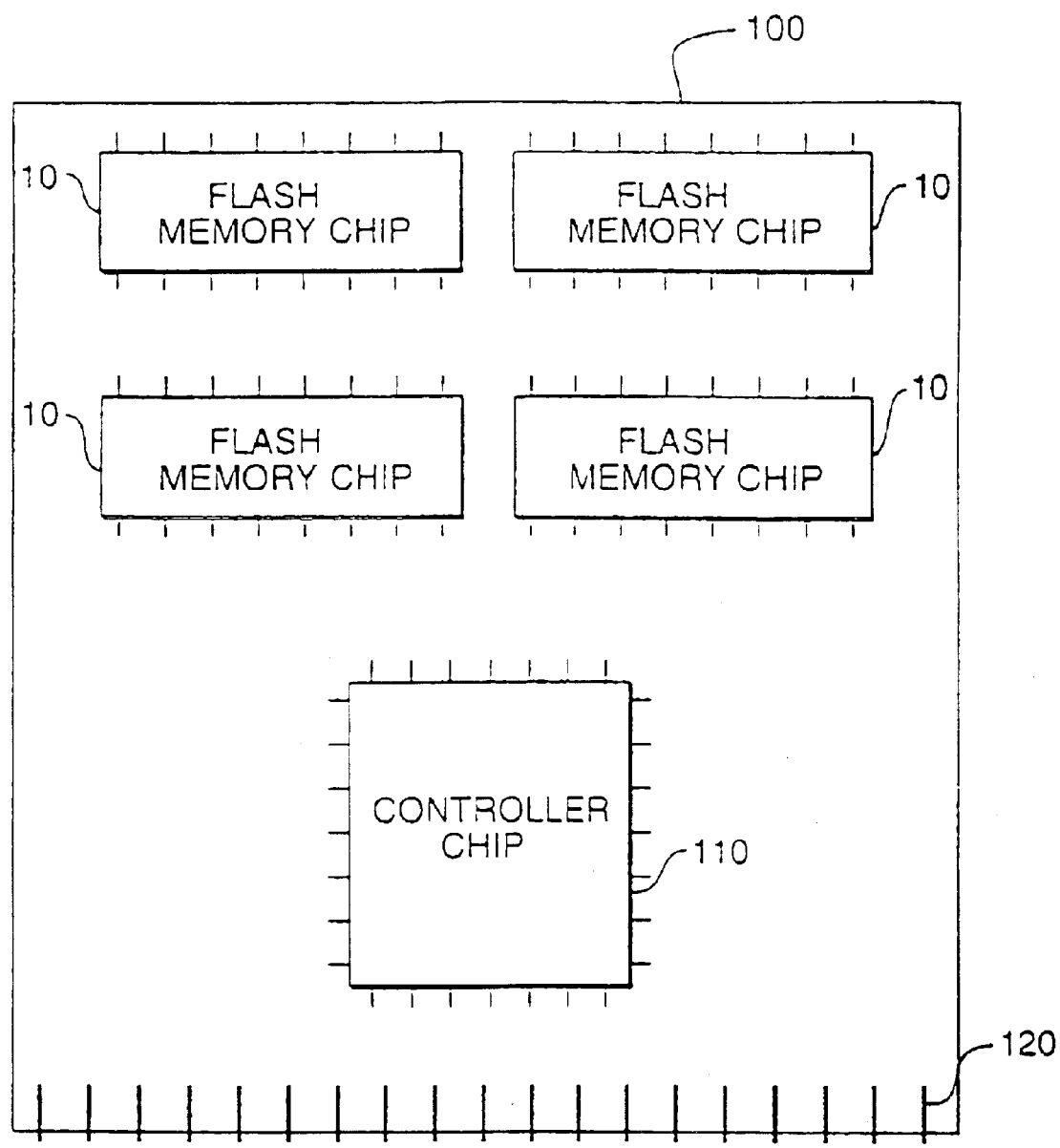
FIG. 17 is a schematic block diagram of a memory card as an example of an application of the flash memory according to the present invention.

FIG. 17 shows a memory card as an application of the flash memory according to the above-described embodiments of the invention. A memory card 100 comprises a plurality of flash memory chips 10 and a controller chip 110 for controlling read/write operations. A bus (not shown) provided in the card is used to connect the controller chip 110 and the flash memory chips 10. The aforementioned additional write command and other commands, a sector address, write data, and control signals such as a write enable signal are supplied from the controller chip 110 via the bus to the flash memory chips; terminals/conductors 120 are provided along one side of the card for signal input/output and power supply.

A description has been given of a nonvolatile memory array for a flash memory, and of a command sequencer for executing instructions, mounted on one chip in Embodiments 1 and 2 of the invention, which may also be implemented in the form of a card as shown in FIG. 17. In this case, importance is attached to a nonvolatile memory system in which the controller chip 110 at least follows an additional write command procedure of FIG. 4.

Other aspects of implementing the present invention, other than the memory card as mentioned above, include a memory card comprising a plurality of flash memory chips with the omission of the controller chip 110, and a personal computer including a CPU to which the aforementioned memory card is connectable. In this case, a program for the CPU contains all commands such as an erase command and a write command necessary for controlling the flash memory; further, the additional write command of FIG. 4 or the macro additional write command as the combination of basic instructions of FIGS. 13–15 may be used for this purpose.

As set forth above, according to the above-described embodiments of the invention, the data stored in a sector at a designated address is read and saved in the register when the predetermined command is issued and the sector is subjected to single-sector erasing. Then, the actual final write data (write expected value data) is formed from the saved data and data to be additionally written and used to perform the writing operation. Therefore, this arrangement has the effect of preventing error data from being read since variation in the threshold of the memory cell due to the disturbance related to the word line is recovered at the time of additional writing.

When additional write data is fed from the outside while the data read from the selected sector is held in the internal register, the writing operation is performed after the write expected value data is automatically and internally formed. Therefore, the additional writing operation can be performed quicker than the ordinary writing operation with the effect of lightening the burden imposed on software at the time of additional writing.

Consequently, it is possible to provide, within the same sector, a mixture of the system area intended for information that is not opened to general users (such as OS and sector control information) and the user area to which the user is allowed to freely write data in the case of flash memories according to above-described embodiments of the invention as shown in FIGS. 22(a)–22(f), whereby the memory is effectively utilizable. This is due to the fact that, in a flash memory of such a storage system, predetermined data is written to the system area and the user area is offered to the user in the unwritten state, and because the additional writing operation is performable when the user writes data thereto.

Control data of FIGS. 22(a)–22(f) include, for example, parity codes, error correction codes, the number of times the sector involved is rewritten, and whether or not the sector contains bad bits; section control information indicative of the usable/unused condition of a section when the sector is divided into a plurality of sections so that each section is additionally writable; and the like.

Although a detailed description has been given of the present invention on the basis of preferred embodiments thereof, the present invention is not limited to these embodiments but may be modified without departure from the spirit and scope of the invention. For example, a description has been given of the case where the two mats have been used to constitute the memory array according to the embodiments of the invention, the present invention is not so limited, but may be applicable to a case where the memory array is divided into a plurality of mats or formed with one mat.

Further, although a description has been given of a flash memory of the single-sector erasing type, the invention is not so limited, but may be widely applicable to nonvolatile memories with FAMOS storage elements, and to semiconductor devices provided with memory cells each having a plurality of thresholds.

The effect obtained from the representative embodiments of the invention disclosed in the present patent application are briefly summarized as follows:

According to the present invention, variation in the threshold of the memory cell due to the disturbance related to the word line in the nonvolatile semiconductor memory is recovered and error data is prevented from being read out. Further, the additional writing operation can be performed quicker than the ordinary writing operation with the effect of lightening the burden imposed on software at the time of additional writing.

We claim:

1. A nonvolatile memory comprising:
   a plurality of nonvolatile memory cells;
   a controller;
   a plurality of latch circuits;
   a plurality of bit lines; and
   a plurality of word lines,
   wherein each of said plurality of nonvolatile memory cells has a first terminal and a second terminal,
   wherein each of said word lines are coupled to said first terminals of corresponding ones of said plurality of nonvolatile memory cells,
   wherein each of said bit lines are coupled to said second terminals of corresponding ones of said plurality of nonvolatile memory cells in parallel, and to a corresponding one of said latch circuits,
   wherein each of said plurality of nonvolatile memory cells coupled to one word line belongs to an arbitrary one of first ones and second ones,
   wherein nonvolatile memory cells belonging to said first ones have already stored first data therein, and each of said nonvolatile memory cells belonging to said first ones has one of a first state and a second state according to said first data,
   wherein each of nonvolatile memory cells belonging to said second ones have said first state, and wherein prior to a program operation of said first ones and said second ones, first latch circuits coupled to said first ones via first bit lines and second latch circuits coupled to said second ones via second bit lines are set with first data and second data, respectively, and wherein after setting of the first and second latch circuits with said first and said second data, said program operation of said first and said second ones are programmed in parallel bit by bit in response to said first data and said second data set in said first and second latch circuits.

2. A nonvolatile memory according to claim 1, wherein after said program operation, each of said first ones has one of said first state and said second state according to said first data, and each of said second ones has one of said first state and said second state according to said second data.

3. A nonvolatile memory according to claim 2, wherein each of said nonvolatile memory cells has a threshold voltage within an arbitrary one of a first threshold voltage range and a second threshold range, said first threshold voltage range corresponds to said first state and said second threshold voltage range corresponds to said second state, and wherein said program operation is to move a threshold voltage of said second ones coupled to said selected word line to one of said first threshold voltage range and said second threshold voltage range according to said second data.

4. A nonvolatile memory according to claim 3, wherein a higher limit voltage of said first threshold voltage range is lower than a lower limit voltage of said second threshold voltage range.

5. A nonvolatile memory according to claim 4, wherein said first threshold voltage range indicates an erase state and said second threshold voltage range indicates to a program state.

6. A nonvolatile memory comprising:

a plurality of nonvolatile memory cells;

a controller;

a plurality of bit lines;

a plurality of word lines; and a latch unit, wherein each of said nonvolatile memory cells has a threshold voltage within an arbitrary one of a plurality of threshold voltage ranges, a first threshold voltage range of said plurality of threshold voltage ranges indicates an erase state and a second threshold voltage range of said plurality of threshold voltage ranges indicates a program state, and has a first terminal, a second terminal and a well region, wherein each of said word lines couples to said first terminals of corresponding ones of said nonvolatile memory cells, wherein each of said bit lines couples to said second terminals of corresponding ones of said nonvolatile memory cells in parallel, wherein each of said nonvolatile memory cells coupled to one word line belongs to an arbitrary one of first ones and second ones, wherein each of said threshold voltages of nonvolatile memory cells belonging to said first ones is within either said first threshold voltage range or said second threshold voltage range according to stored first data, wherein each of said threshold voltages of nonvolatile memory cells belonging to said second ones is within said first threshold voltage range, wherein said well regions of adjacent nonvolatile memory cells coupled to one word line are connected, wherein said controller carries out a program operation, in response to receiving a first command with a second data, wherein in said program operation, said controller selects one word line, reads out first data from first ones coupled to selected word line, and sets said first data and said second data to said latch unit, wherein after setting said first data and said second data to said latch unit in said program operation, said controller carries out supply of a first voltage to said selected word line so that said first ones and second ones are programmed in parallel in response to said first data and said second data set in said latch unit.

7. A nonvolatile memory according to claim 6, wherein said controller controls, in response to receiving a second command, selection of one word line and supplying of a second voltage to a selected word line for changing each threshold voltage of said first ones and second ones to be within said first threshold voltage range.

8. A nonvolatile memory according to claim 7, wherein said latch unit comprises a plurality of latch circuits, wherein each of said latch circuits couples to a corresponding bit line, wherein said controller controls setting of a flag to said latch circuits coupled to memory cells objected to change threshold voltage from said first threshold voltage range to said second threshold voltage range before supplying said first voltage to said selected word line.

9. A nonvolatile memory according to claim 8, wherein said controller controls changing of threshold voltages of memory cells, threshold voltages which are within said second threshold voltage range, to within an intermediate range between said first threshold voltage range and said second threshold voltage range before supplying said first voltage to said selected word line.

* * * * *